United States Patent
Takizawa et al.

(10) Patent No.: US 6,876,201 B2
(45) Date of Patent: Apr. 5, 2005

(54) MAGNETIC RESONANCE IMAGING APPARATUS AND METHOD

(75) Inventors: Masahiro Takizawa, Chiba (JP); Tetsuhiko Takahashi, Saitama (JP); Hisaaki Ochi, Tokyo (JP); Yo Taniguchi, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/468,963
(22) PCT Filed: Feb. 25, 2002
(86) PCT No.: PCT/JP02/01653
§ 371 (c)(1), (2), (4) Date: Feb. 17, 2004
(87) PCT Pub. No.: WO02/065907
PCT Pub. Date: Aug. 29, 2002

(65) Prior Publication Data
US 2004/0135579 A1 Jul. 15, 2004

(30) Foreign Application Priority Data
Feb. 23, 2001 (JP) ................................ 2001-047700
Apr. 20, 2001 (JP) ................................ 2001-122213

(51) Int. Cl.$^7$ ................................................ G01V 3/00
(52) U.S. Cl. ........................................ 324/318; 324/319
(58) Field of Search ................................ 324/318, 319, 324/322, 309, 307, 311

(56) References Cited

U.S. PATENT DOCUMENTS

| | | | | |
|---|---|---|---|---|
| 5,712,567 A | * | 1/1998 | Wang | 324/307 |
| 5,808,467 A | * | 9/1998 | Ochi et al. | 324/309 |
| 6,326,786 B1 | * | 12/2001 | Pruessmann et al. | 324/312 |
| 6,611,143 B2 | * | 8/2003 | Kuhara | 324/307 |
| 6,777,934 B2 | * | 8/2004 | Takahashi et al. | 324/309 |

* cited by examiner

Primary Examiner—Brij B. Shrivastav
(74) Attorney, Agent, or Firm—Cooper & Dunham LLP

(57) ABSTRACT

A magnetic resonance imaging apparatus includes a magnetic field generation means for applying gradient magnetic fields and a radio-frequency magnetic field to a patient placed in a static magnetic field in a predetermined pulse sequence; a multiple RF receiving coil comprising at least three RF receiving coils for receiving the nuclear magnetic resonance signals generated from the patient; and an image reconstruction means for reconstructing an image by processing the received nuclear magnetic resonance signals, wherein the image reconstruction means includes a coil selection means for selecting a plurality of RF receiving coil groups that are preset by combining the plurality of RF receiving coils according to imaging conditions, a synthesization means for synthesizing the measured data received by the respective RF receiving coils of each of the plurality of selected RF receiving coil groups, and a calculation means for eliminating aliasing artifacts by executing a matrix calculation as to the synthesized data.

18 Claims, 13 Drawing Sheets

DIRECTION OF STATIC MAGNETIC FIELD

MAGNETIC RESONANCE IMAGING APPARATUS AND METHOD

TECHNICAL FIELD

The present invention relates generally to a nuclear magnetic resonance imaging (hereinafter, referred to as "MRI") method and apparatus that measures nuclear magnetic resonance (hereinafter, referred to as "NMR") signals from hydrogen and phosphorus in a patient and transforms the density distribution and the relaxation time distribution of nuclear spins into images. More particularly, the present invention relates to an MRI apparatus that uses a plurality of RF (radio-frequency) receiving coils and eliminates aliasing artifacts, which are generated when signals are obtained by the respective RF receiving coils thinning phase encodes, by a matrix calculation using the sensitivity distributions of the respective RF coils.

BACKGROUND ART

An MRI apparatus obtains echo signals necessary to reconstruction of a sheet of an image by repeatedly executing a pulse sequence (hereinafter, simply referred to as "sequence") while varying an amount of phase encode. Accordingly, an imaging time is greatly affected by the number of repetition of the sequence. When an imaging is executed at a high speed, a multi-echo type sequence is ordinarily used to generate a plurality of echo signals by executing the sequence once. Further, a sequence whose repetition intervals are shortened to several to several tens of microseconds is used. However, these sequence may decrease an image contrast or distort an image. This is because the echo time that contributes to the image contract is different in the respective echo signals in the multi-echo type sequence. Otherwise, this is because when a phase varies differently between respective echo signals due to a different echo time, this phase variation appears as distortion of an image.

In contrast, a high speed imagig called a parallel imaging method is proposed to take a picture of a heart region such as a coronary artery because it is necessary to measure an image at a higher speed in this case. The parallel imaging method is a method of reducing an imaging time by reducing the number of repetition of a sequence by using a plurality of RF receiving coils (multiple RF receiving coil) and executing the sequence while thinning phase encodes at equal intervals. Ordinarily, when an image is constructed as it is using signals measured by thinning the phase encodes at equal intervals, aliasing occurs in the image. To cope with this problem, there are heretofore known a signal processing method (SENSE: Sensitivity Encoding for Fast MRI (Klass P. Pruessmann et. al, Magnetic Resonance in Medicine 42: pp 952–962 (1999)) and the like that eliminate the aliasing of the image by executing a matrix calculation based on the sensitivity distributions of the respective RF receiving coils. That is, the signals measured from the portions of an image having aliasing are superimposed with the signal components of different aliased regions. To cope with this problem, the aliasing portions of the image are unfolded by establishing simultaneous equations according to the correlation among the signals measured by the plurality of RF receiving coils, the sensitivity distributions of the respective RF receiving coils, and the signal components at a plurality of points on a measuring space, by solving the simultaneous equations by a matrix calculation, and by separately determining the signal components of the region where the aliasing portions overlap. In general, in the parallel imaging method, an imaging time can be shorted by the number of the RF receiving coils used in the matrix calculation. That is, in principle, phase encode matrixes as many as the number N of the RF receiving coils used in the matrix-calculation can be thinned, thereby the imaging time can be shortened to 1/N.

However, an image cannot be properly unfolded because the matrix calculation may be diverged depending on the positional relationship among the plurality of RF receiving coils used in the matrix calculation or a combination of the sensitivity distributions of the RF receiving coils. For example, there is no difference in the sensitivity distributions among the RF receiving coils used in the matrix calculation, the image may not be properly unfolded because the matrix calculation is diverged. Further, when the matrix calculation is executed while including the signal components of a low signal region such as a background and the like, an error may be increased by the affect of noise when aliasing portions are unfolded. As a result, the SN ratio of an image having been unfolded may be extremely deteriorated or spot artifacts may occur in an image.

Further, even if the positional relationship among the RF receiving coils used in the matrix calculation is optimum with respect to a specific direction, there is a possibility that artifacts and deterioration in image quality may occur in a resultant image when a measuring axis and a measuring slice section are varied or when an encode axis is varied.

On the other hand, according to the aliasing elimination method employing the matrix calculation described above, it is necessary to improve the accuracy of the sensitivity distributions of the respective RF receiving coils. To accurately calculate the sensitivity distributions of the respective RF receiving coils, the sensitivity distributions of the respective RF receiving coils are calculated using an image calculated by an entire body coil having a relatively uniform sensitivity distribution.

However, since there is an MRI apparatus that is not provided with the entire body coil, it is preferable that the aliasing portions of an image be accurately eliminated even in such a case. Further, when the number of channels of received signals is small, there is a case that images transformed from the sensitivity distributions of the respective RF receiving coils and images transformed from the sensitivity distribution of the entire body coil cannot be obtained simultaneously.

DISCLOSURE OF THE INVENTION

An object of the present invention is to more reduce occurrence of the artifacts of an image and to obtain an image having higher image quality in an MRI apparatus provided with a function for eliminating the aliasing portions of an image by executing a matrix calculation with respect to the signals obtained by a plurality of RF receiving coils.

An MRI apparatus of the present invention for achieving the above object comprises a magnetic field generation means for applying gradient magnetic fields and a radio-frequency magnetic field to a patient placed in a static magnetic field in a predetermined pulse sequence; a plurality of RF receiving coils for receiving the nuclear magnetic resonance signals generated from the patient; and an image reconstruction means for reconstructing an image by processing the nuclear magnetic resonance signals measured by thinning the encode steps in a measuring space, wherein the image reconstruction means determines measured signal components at a plurality of points on a measuring slice section by a matrix calculation based on the correlation among the measured signals received by the RF receiving coils, the sensitivity distributions of the RF receiving coils and the measured signal components at the plurality of points on the measuring slice section as well as comprises means for eliminating for suppressing or eliminating the low signal region of the measured signals measured on the measuring slice section.

An MRI apparatus of the present invention is characterized by comprising a magnetic field generation means for applying gradient magnetic fields and a radio-frequency magnetic field to a patient placed in a static magnetic field in a predetermined pulse sequence; a multiple RF receiving coil comprising at least three RF receiving coils for receiving the nuclear magnetic resonance signals, generated from the patient; and an image reconstruction means for reconstructing an image by processing the received nuclear magnetic resonance signals, wherein the image reconstruction means comprises coil selection means for selecting a plurality of RF receiving coil groups that are preset by combining the plurality of RF receiving coils according to imaging conditions; a synthesization means for synthesizing the measured data received by the respective RF receiving coils of each of the plurality of selected RF receiving coil groups and calculation means for eliminating aliasing artifacts by executing a matrix calculation as to the synthesized data.

In this case, it is preferable that each of the plurality of preset RF receiving coil groups be set based on sensitivity distributions as to a phase encode axis in a measuring space. Further, the calculation means may eliminate aliasing artifacts by unfolding the aliasing of an image by establishing simultaneous equations representing the correlation between the synthesized data and the measured signal components at the plurality of points on the measuring slice section and determining the measured signal components at the plurality of points on the measuring slice section by solving the simultaneous equations by a matrix calculation.

As described above, a low resistivity region can be eliminated as to an arbitrary measuring slice section and phase encode axis by using the synthesized data of the combinations of the plurality of RF receiving coils (RF receiving coil groups). As a result, an image having a good SN and not having artifacts and quality deterioration due to the diversion of a matrix calculation and the like can be obtained by executing the matrix calculation based on the sensitivity distributions of the plurality of receiving coil groups. Further, the number of matrixes in the matrix calculation can be reduced, thereby a load on calculation processing can be decreased.

Further, the number G of the plurality of RF receiving coil groups selected by the coil selection means is preferably set to G=M when the thinning rate of a phase encode is set to 1/M in an imaging. At this time, since a subject of the matrix calculation is a square matrix, the load on the calculation processing can be reduced. It is optimum that G=M=2. Further, a plurality of RF receiving coils constituting an RF receiving coil group may include the same RF receiving coil as that constituting other RF receiving coil group.

In contrast, in an MRI method of obtaining an image using a magnetic resonance imaging apparatus comprising a multiple RF receiving coil including at least three RF receiving coils by processing nuclear magnetic resonance signals received by the respective RF receiving coils by executing an imaging by thinning encode steps in a phase encode direction and/or in a slice encode direction, the MRI method comprises the steps of selecting a plurality of combinations each including a plurality of RF receiving coils according to a measuring slice section or to the phase encode direction and/or the slice encode direction; synthesizing the data measured by the respective RF receiving coils of the selected combinations of the RF receiving coils; and creating image data from which aliasing artifacts are eliminated by executing a matrix calculation using measured and synthesized data and sensitivity distribution as to each combination of the RF receiving coils.

Further, in other MRI apparatus for achieving the above comprising at least two RF receiving coils and a control means for obtaining images from the respective RF receiving coils by measuring the nuclear magnetic resonance signals received by the RF receiving coils by thinning the encode steps in a measuring space and executing a calculation for eliminating the aliasing of the respective images using the receiving sensitivity distributions of the respective RF receiving coils as well as obtaining a single image by coupling the respective images, the MRI apparatus is characterized in that the control means creates a mask, which is divided into a non-image region and an image region, to an image obtained in a final measurement based on image data obtained by the above measurement and executes a calculation for eliminating the aliasing using the mask.

In this case, the image data obtained by the previous calculation may be measured using an entire body coil, or the image data of an entire field of view in a final measurement may be imitated by synthesizing the measured data used in the plurality of RF receiving coils provided with the MRI apparatus.

Note that the aliasing eliminating calculation may eliminate the aliasing of the image by establishing simultaneous equations representing the correlation between the nuclear magnetic resonance signals received by the respective RF receiving coils and the signal components at the plurality of points on the measuring slice section and determining the signal components at the plurality of point on the measuring slice section by solving the simultaneous equations by a matrix calculation.

Further, the control means may create a mask in which a non-image region and an image region are divided in the receiving sensitivity distributions of an entire region including the RF receiving coils and execute a calculation using the receiving sensitivity distribution of each RF receiving coil and the mask.

Further, the non-image region in the receiving sensitivity distributions may be a low signal region, the receiving sensitivity distributions of the entire region including the RF receiving coils may be determined by executing a calculation using the signals from the plurality of RF receiving coils, and there may be provided a second RF receiving coil covering a receiving region including the receiving regions of the plurality of RF receiving coils, and the control means may obtain the receiving sensitivity distributions-of the entire region by the second RF receiving coil.

Further, in a magnetic resonance imaging apparatus comprising a plurality of RF receiving coils and a control means for obtaining a sensitivity image and a morphological image of each of the RF receiving coils by measuring the nuclear magnetic resonance signals received by the RF receiving coils by thinning the encode steps in a measuring space and executing a calculation for eliminating the aliasing of the respective morphological images from the sensitivity distributions based on the sensitivity images of the RF receiving coils as well as obtaining a single morphological image by coupling the above respective morphological images, the MRI apparatus is characterized in that the control means creates an entire sensitivity image in which the sensitivity images obtained by the respective RF receiving coils are combined, calculates the sensitivity distributions of the respective RF receiving coils using the entire sensitivity distribution, creates a mask for dividing the non-image region and the image region of an image using the entire sensitivity image, and executes a calculation based on the mask.

In a magnetic resonance imaging apparatus comprising a first RF receiving coil for receiving an entire measuring region, a plurality of second RF receiving coils for receiving a region in which the entire measuring region is divided into at least two sub-regions, and a control means for obtaining a sensitivity image a morphological image of each of the RF second receiving coils by measuring the nuclear magnetic resonance signals received by the second RF receiving coils by thinning the encode steps in a measuring space and for executing a calculation for eliminating the aliasing of the morphological images from the sensitivity distributions determined from the sensitivity image created by the first RF receiving coil and the sensitivity distributions determined from the sensitivity images created by the second RF receiving coils as well as obtaining a single morphological image by coupling the respective morphological images, the magnetic resonance imaging apparatus characterized in that the control means creates a mask in which a non-image region and an image regions are divided in the receiving sensitivity distributions and executes a calculation using the mask.

Further, an MRI apparatus of the present invention comprises a first RF receiving coil for receiving the nuclear magnetic resonance signals generated from the entire measuring region of a patient; a plurality of second RF receiving coils for receiving the nuclear magnetic resonance signals generated from the patient, and an image reconstruction means for reconstructing an image by processing the nuclear magnetic resonance signals received by thinning the encode steps in a measuring space, wherein the image reconstruction means comprises a coil selection means for selecting a plurality of RF second receiving coil groups that are preset by combining the plurality of second RF receiving coils according to image measuring conditions; a first synthesization means for synthesizing the present measured data received by the respective second RF receiving coils of each of the plurality of selected second RF receiving coil groups; a second synthesization means for synthesizing the previous measured data received by the respective second RF receiving coils of each of the plurality of selected second RF receiving coil groups; a sensitivity distribution calculation means for calculating the sensitivity distribution of each of the second RF receiving coil groups based on the second synthesized data synthesized by the second synthesization means; a low signal region setting means for setting the low signal region on a measuring slice section based on the data measured by the second synthesization means; and a matrix calculation means for eliminating aliasing artifacts by executing a matrix calculation excluding the sensitivity distribution of each of the RF receiving coil groups and the data included in the low signal region, which is set by the low signal region setting means, of the first synthesized data synthesized by the first synthesization means.

Further, the image reconstruction means may comprises a pseudo image creation means for creating a pseudo image corresponding to the sensitivity image of an entire measuring region based on the previous measured data received by the respective RF receiving coils; a sensitivity distribution calculation means for calculating the sensitivity distributions of the respective RF receiving coils by normalizing the previous measured data received by the respective RF receiving coils by the pseudo image; and a matrix calculation means for eliminating aliasing artifacts by a matrix calculation using the present measured data received by the RF receiving coils and the sensitivity distributions of the respective RF receiving coils calculated by the sensitivity distribution calculation means.

In this case, the image reconstruction means may includes a coil selection means for selecting a plurality of second RF receiving coil groups that are preset by combining the plurality of second RF receiving coils according to imaging conditions, synthesized data created by synthesizing the present measured data of each of the plurality of selected RF receiving coil groups may be used as the present measured data received by the respective RF receiving coils is, and synthesized data created by synthesizing the present measured data of each of the plurality of selected RF receiving coil groups may be slice encode direction as the previous measure data received by the respective RF receiving coils.

BRIEF DESCRIPTION OF THE DRAWINGS

FIGS. 10(A) to 10(D) are views explaining other RF receiving coils to which the present invention can be applied;

BEST MODE FOR CARRYING OUT THE INVENTION

MRI apparatuses of the present invention will be described in detail with reference to the drawings.
(First Embodiment)

Figure 1:
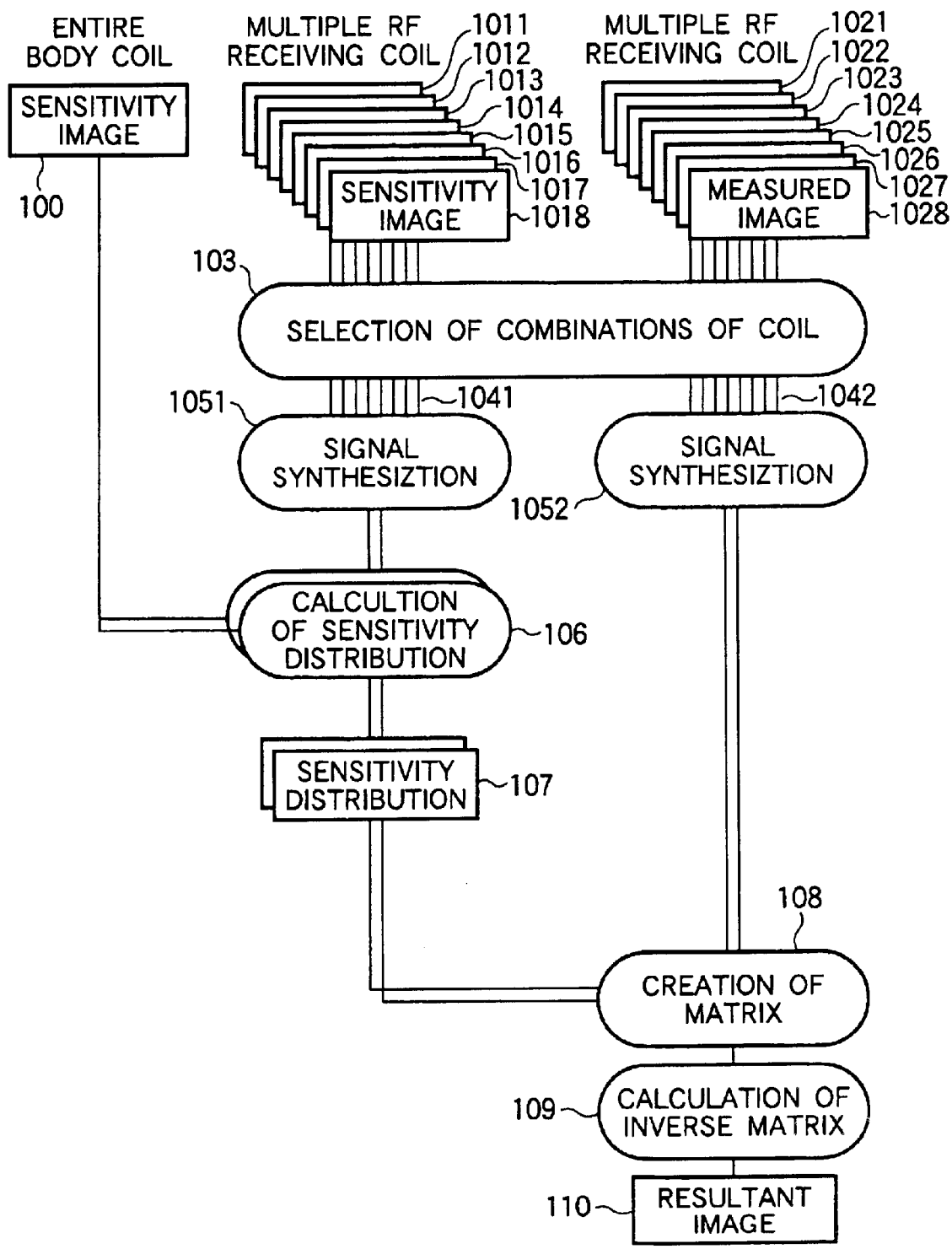
FIG. 1 is a flowchart showing a signal processing sequence in an image reconstruction device according to an. MRI apparatus of a first embodiment of the present invention.
Figure 2:
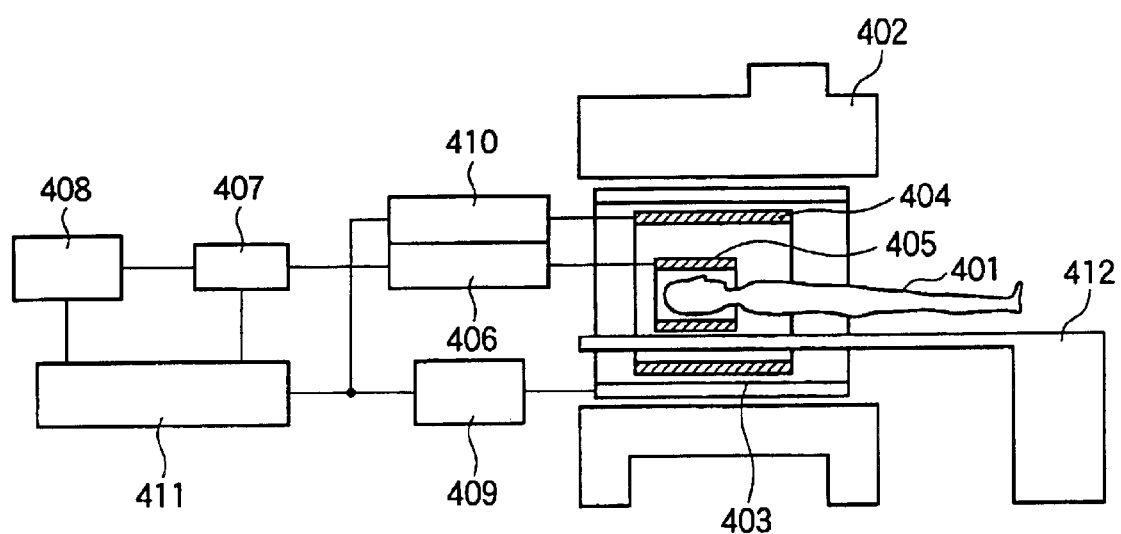
FIG. 2 is a block diagram of a typical arrangement applicable to the MRI apparatus of the present invention.

A first embodiment of the present invention will be explained with reference to FIGS. 1 to 10. As shown in FIG. 2, a typical MRI apparatus includes a magnet 402 for generating a static magnetic field in the space of a periphery including a patient 401, a gradient magnetic field coil 403 for generating gradient magnetic fields in the space, an RF transmission coil 404 for generating a radio-frequency magnetic field in the region, and an RF probe 405 for detecting the NMR signals generated by the patient 401. Although the figure shows an MRI apparatus having a vertical magnetic field in which a static magnetic field is generated in a vertical direction, a MRI apparatus having a horizontal magnetic field in which the static magnetic field is generated in the body axis direction of the patient 401 may be employed.

The gradient magnetic field coil 403 is composed of a plurality of coils for generating the gradient magnetic fields in X-, Y- and Z-directions and generate the gradient magnetic fields, respectively in response to the signal from a gradient magnetic field power supply 409. The RF transmission coil 404 generates the radio-frequency magnetic field in response to the signal output from an RF transmission unit 410. The signals received by the RF probe 405 are detected by a signal detection unit 406 and processed by a signal processing unit 407 as well as converted into an image signal by being subjected to calculation processing. An image is displayed on a display unit 408. The gradient magnetic field power supply 409, the RF transmission unit 410, and the signal detection unit 406 are controlled by a controller 411. A timing chart for control is ordinarily called a pulse sequence. The patient 401 lies on a bed 412.

The MRI apparatus of the present invention employs a technology called a "multiple RF receiving coil" or a "phased array coil" using a plurality of RF receiving coils as the RF probe 405. According to this technology, a plurality of small RF receiving coils each having a relatively high sensitivity are arranged, and a field of view is unfolded as well as a sensitivity is increased while maintaining the high sensitivities of the RF receiving coils by synthesizing the signals obtained by the respective RF receiving coils.

Figure 3A:
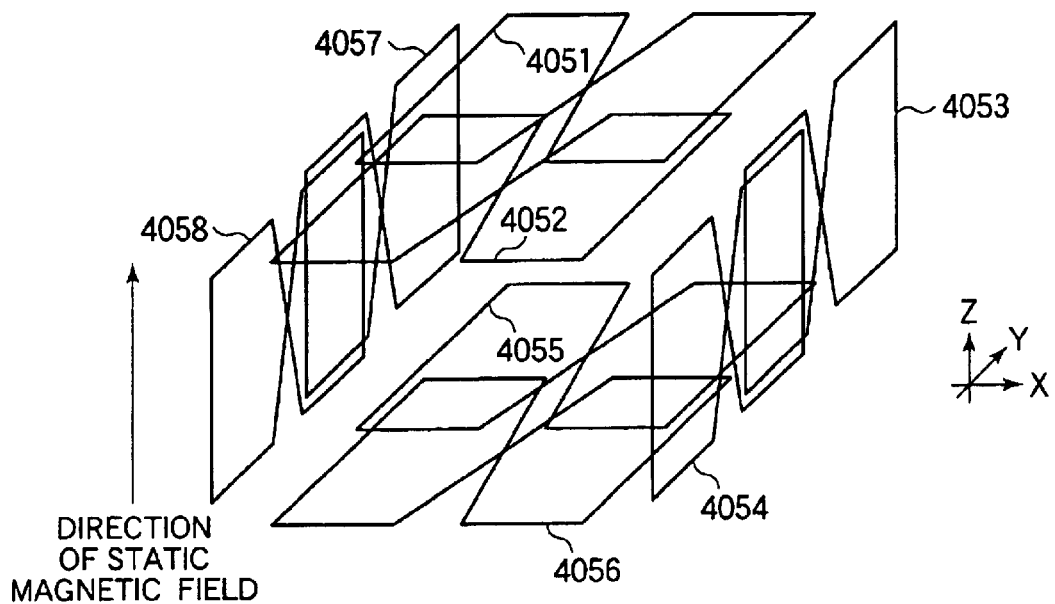
FIGS. 3(A) to 3(C) are views explaining examples of multiple RF receiving coil.
Figure 3B:
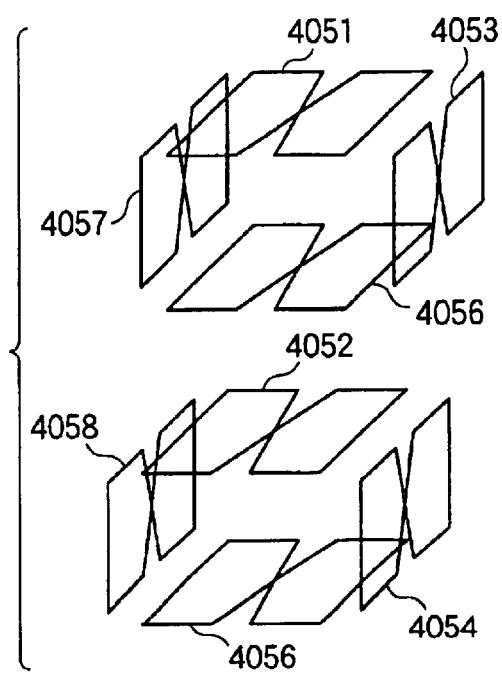
Figure 3C:
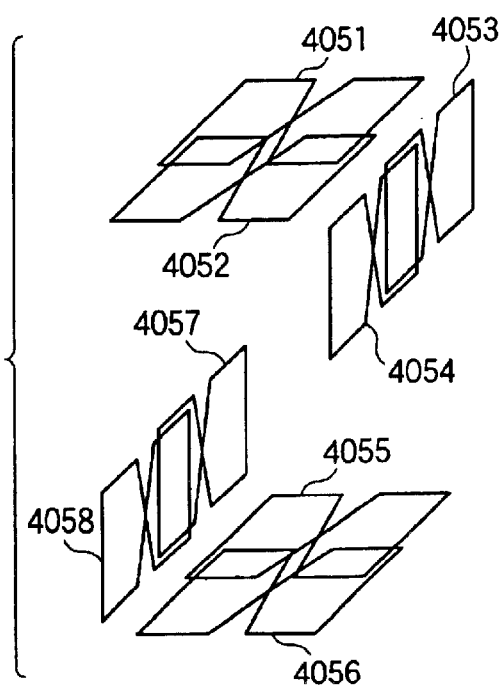

FIGS. 3(A) to 3(C) shows an example of the multiple RF receiving coil for the vertical magnetic field. The multiple RF receiving coil are composed of eight "8-shaped" RF receiving coils 4051 to 4058, and each two of the RF receiving are disposed in confrontation with each other on an X-Y plane and a Y-Z plane with a predetermined distance therebetween. Then, these RF receiving coils receive the NMR signals from the patient 401 placed in the space surrounded thereby.

Note that, in the figure, the components shown by four-digit numerals having the same upper three-digits show the same components, and the numerals of the lowermost one-digit are added to identify the plurality of the same components from each other (this is applied likewise in the specification).

Figure 4:
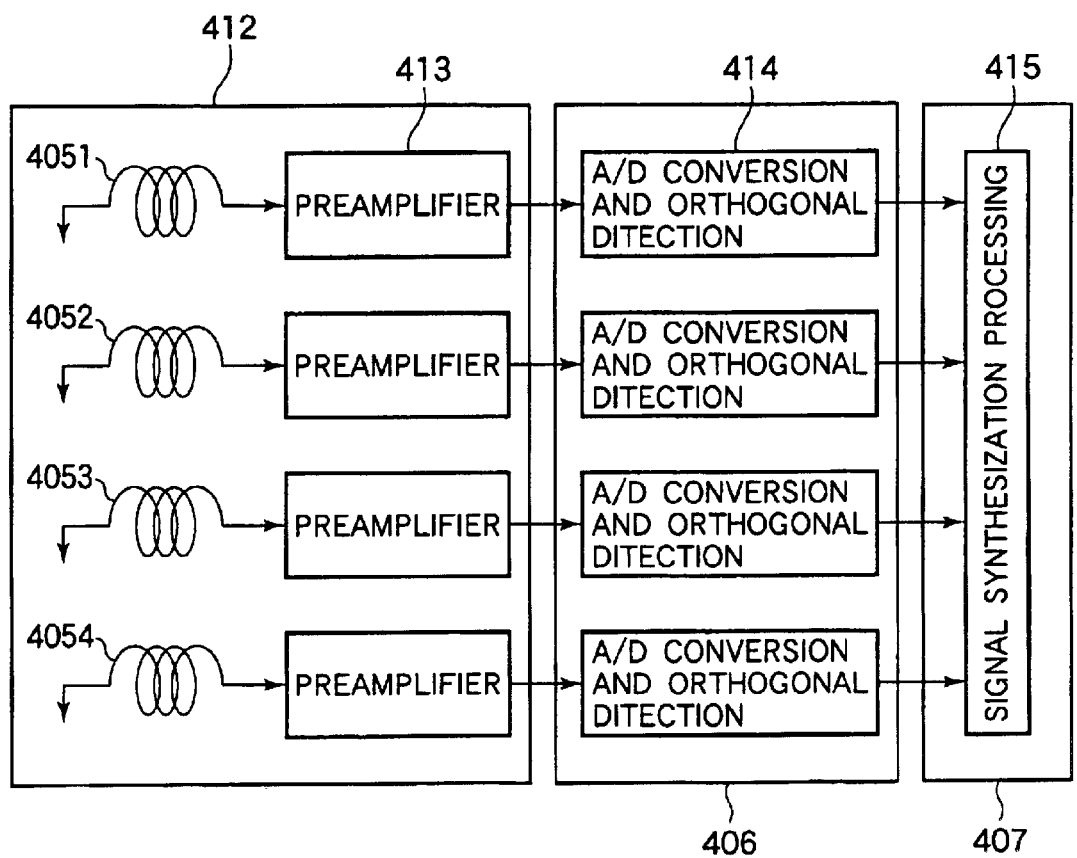
FIG. 4 is a block diagram showing the arrangement of a receiving unit of the signals measured by the RF receiving coils.
Figure 5:
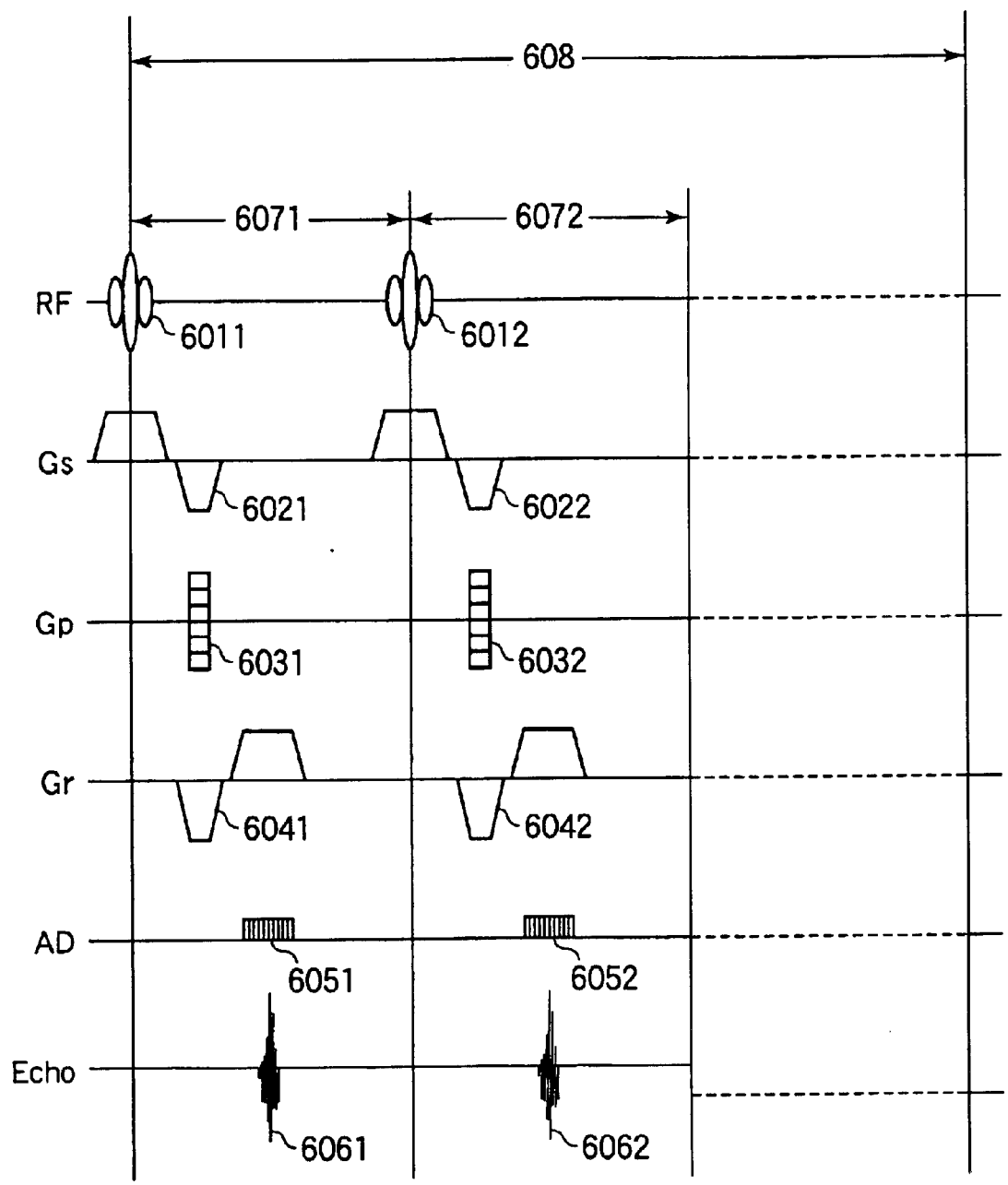
FIG. 5 shows an example of a pulse sequence applicable to the MRI apparatus of the present invention.

FIG. 4 shows a part of the signal detecting portion of the multiple RF receiving coil. The eight RF receiving coils 405 (4051 to 4058) are connected to preamplifiers 413, respectively and constitute the single multiple RF receiving coil 412. The signal detection unit 406 is composed of eight A/D conversion and orthogonal detection circuit 414 which are arranged in parallel with each other and to which the outputs from respective preamplifiers 413 are connected. The signal processing unit 407 includes a signal synthesization processing sub-unit 415 which synthesizes the signals from the respective RF receiving coils, subjects the synthesized signals to processing such as Fourier transform, a back projection method, wavelet transform, and the like, and creates image data.

A imaging method and a signal processing method executed by the MRI apparatus arranged as described above will be explained below. Ordinary spin echo and gradient echo sequences can be employed as the imaging method. That is, in the gradient echo sequence as shown in, for example, FIG. 5, after radio-frequency pulses 601 and slice selection gradient magnetic field pulses 602 are applied, phase encode gradient magnetic field pulses 603 and reading-out gradient magnetic field pulses 604 are applied, and echo signals 606 are measured in a sampling window 605. This sequence is repeated in repeating times 607. At the time, a set of echo signals as many as the number of phase encode matrixes necessary to reconstruct a sheet of an image is obtained by varying the intensity of the phase encode gradient magnetic fields 603 each time the sequence is repeated.

In an ordinary imaging method, values such as 64, 128, 256, 512, and the like are selected as the number of the phase encode matrixes in consideration of a field of view (FOV) and a special resolution. The respective echo signals are ordinarily obtained as time-series signals composed of 128, 256, 512, or 1024 pieces of sampling data. A sheet of an MR image is obtained by subjecting the data to two-dimensional Fourier transform. In contrast, imaging using the multiple RF receiving coil is executed by thinning encode steps at an appropriate thinning rate using the same number of phase encode matrixes. When, for example, the number of phase encodes is 64, all the data of the phase encodes from 1 to 64 is ordinarily measured, whereas, in the high speed imaging method employed by the present invention, the data of the phase encodes 1, 3, 5, . . . , 63 that is obtained by alternately thinning the above data is measured. In this case, the thinning rate is ½.

Figure 6A:
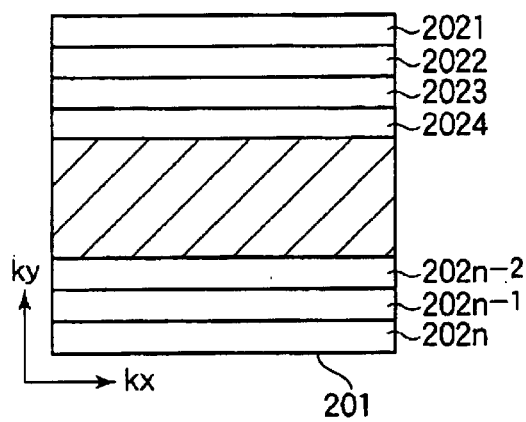
FIGS. 6(A) to 6(D) are views explaining the aliasing of an image in a parallel imaging method.
Figure 6B:
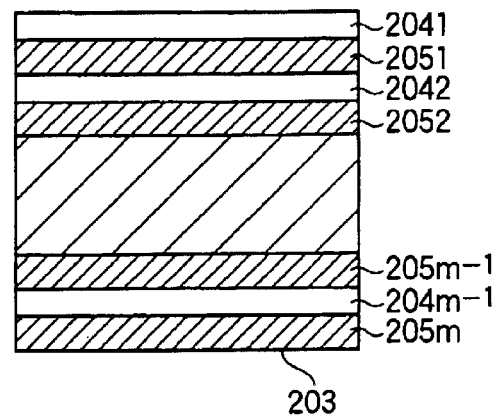
Figure 6C:
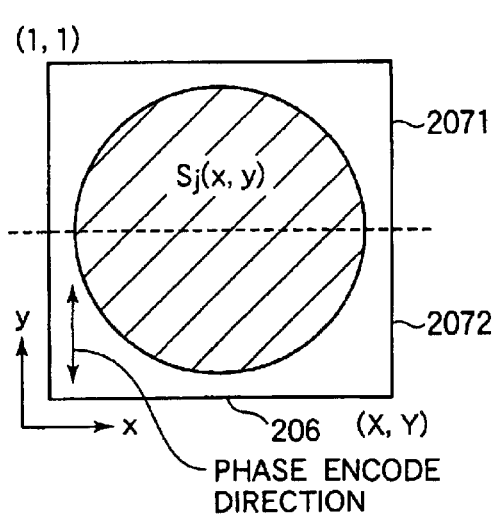
Figure 6D:
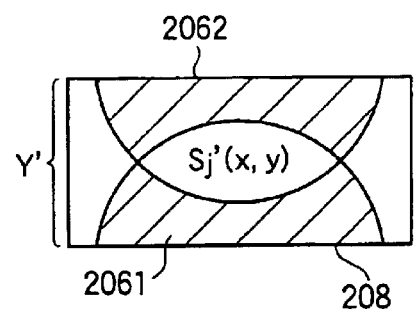

Aliasing of an image in the parallel imaging method will be explained with reference to FIGS. 6(A) to 6(D). FIG. 6(A) shows a case of the ordinary imaging method, wherein signals 202 (202*l* to 202*n*) obtained in the respective amounts of phase encodes are disposed in a k space and used as data 201 for a sheet of an image. FIG. 6(C) shows an image 207 obtained by subjecting the above data to Fourier transform. In contrast, in the parallel imaging method, the intervals of phase encode steps are, for example, doubled as to the same FOV as that of the ordinary imaging, and data is measured by being thinned as shown in FIG. 6(B). In this case, since data 204 of every other line is measured, the data corresponding to the positions of 205 (205*l* to 205*m*) is not measured. In this case, since the amount of measured data is reduced to half, when an image is created by reducing matrixes to half, an image 208, in which aliasing occurs, is obtained as shown in FIG. 6(D). Since a y-direction is used as a phase encode direction in FIG. 6, the aliasing is occurred by that an image in the phase encode direction is aliased. That is, an image 2061 of a patient in the upper region 2071 of an image 207 as shown in FIG. 6(C) overlaps an image 2062 of a patient in the lower region 2027 of the image 207, thereby the image 208 having aliasing is created as shown in FIG. 6(D).

The signal aliasing generated as described above is eliminated by a signal processing method called SENSE as described above. A calculation method for eliminating the aliasing will be explained here. When image matrixes in x- and y-directions are represented by X and Y, respectively, pixel values in a coordinate (x, y) (where, $1 \leq x \leq X$, $1 \leq y \leq Y$) in an image is represented by Si(x, y). Here, a suffix "i" shows the number of the RF receiving coils and $2 \leq i \leq N$. In FIG. 6(D), since the data is thinned by doubling the intervals of the phase encode steps, the matrix of the image having been thinned in the phase encode direction is represented by Y'=Y/2. When the coordinate of the image shown in FIG. 6(D) is represented by (x, y') (where, $1 \leq y' \leq Y'$), the pixel value s' (x, y') of the image is represented by Expression 1 because the two regions 2071 and 2027 of the intrinsic image 207 overlap. In Expression 1, a represents a constant.

$$s'_i(x, y') = \frac{s_i(x, y') + s_i(x, y' + Y')}{a} \quad (1)$$

Next, the sensitivity distributions of the RF receiving coils and an image will be described. When the two-dimensional sensitivity distribution of an i-th RF receiving coil is represented by ci(x, y), a received signal si(x, y) is represented by Expression (2) because it is a product of the sensitivity distribution ci(x, y) of the RF receiving coil and the density distribution of protons p(x,y) of a patient.

$$si(x, y) = ci(x, y) \times p(x, y) \quad (2)$$

When Expression (2) is used here, Expression (1) can be represented by Expression (3).

$$s'_i(x, y') = \frac{c_i(x, y') \times p_i(x, y')}{a} + \frac{c_i(x, y' + Y') \times p(x, y' + Y')}{a} \quad (3)$$

$$= \frac{1}{a} \sum_{j=1}^{2} c_i(x, y' + (j-1) \times Y') \times p(x, y' + (j-1) \times Y')$$

When the following expressions (4) are established for simplification, Expression (3) can be represented by $$Si = s'i(x, y') \quad Cij = ci(x, y' + (j-1) \times Y') \quad Pj = pi(x, y' + (j-1) + Y') \quad (4)$$

$$S_i = \frac{1}{a} \sum_{j=1}^{2} C_{ij} \times P_j \quad (5)$$

Expression (5) can be expressed by Determinant (6) having a matrix of N rows×2 columns.

$$\begin{pmatrix} S_1 \\ S_2 \\ \vdots \\ S_N \end{pmatrix} = \frac{1}{a} \begin{pmatrix} C_{11} & C_{12} \\ C_{21} & C_{22} \\ \vdots & \vdots \\ C_{N1} & C_{N2} \end{pmatrix} \begin{pmatrix} P_1 \\ P_2 \end{pmatrix} \quad (6)$$

When the sensitivity distributions Cij of the RF receiving coils are found from Determinant (6), the density distribution Pj of the nuclei (for example, protons) of a portion to be measured of the patient can be determined by calculating an inverse matrix.

Likewise, a general expression when imaging is executed at a speed of M times using N pieces of coils can be represented by Determinant (7) assuming that Y'=Y/M and $1 \leq y' \leq Y'$.

$$\begin{pmatrix} S_1 \\ S_2 \\ \vdots \\ S_N \end{pmatrix} = \frac{1}{b} \begin{pmatrix} C_{11} & C_{12} & \cdots & C_{1M} \\ C_{21} & C_{22} & \cdots & C_{2M} \\ \vdots & \vdots & \ddots & \vdots \\ C_{N1} & C_{N2} & \cdots & C_{NM} \end{pmatrix} \begin{pmatrix} P_1 \\ P_2 \\ \vdots \\ P_M \end{pmatrix} \quad (7)$$

In the above expression, b represents a constant.

As described above, the density distribution of the nuclei of the portion to be measured can be determined as image data from which aliasing is eliminated by executing a matrix calculation of Expression (7) as to the measured data s'i(x, y') using the sensitivity distributions Cij of the RF receiving coils.

Note that the relationship between the number of the RF receiving coils and a multiple-speed number in the parallel imaging method is mathematically represented by $N \geq M$. Further, in the parallel imaging method, the sensitivity distributions Cij of the respective RF receiving coils are ordinarily obtained by previously measuring them. However, it is said difficult to directly obtain the sensitivity distributions Cij from measured data. Thus, it is preferable to obtain the approximate sensitivity distributions of the RF receiving coils by dividing the image data obtained by the respective RF receiving coils by the image data of an entire body coil whose sensitivity distribution is relatively uniform.

Figures 7A, 7B:
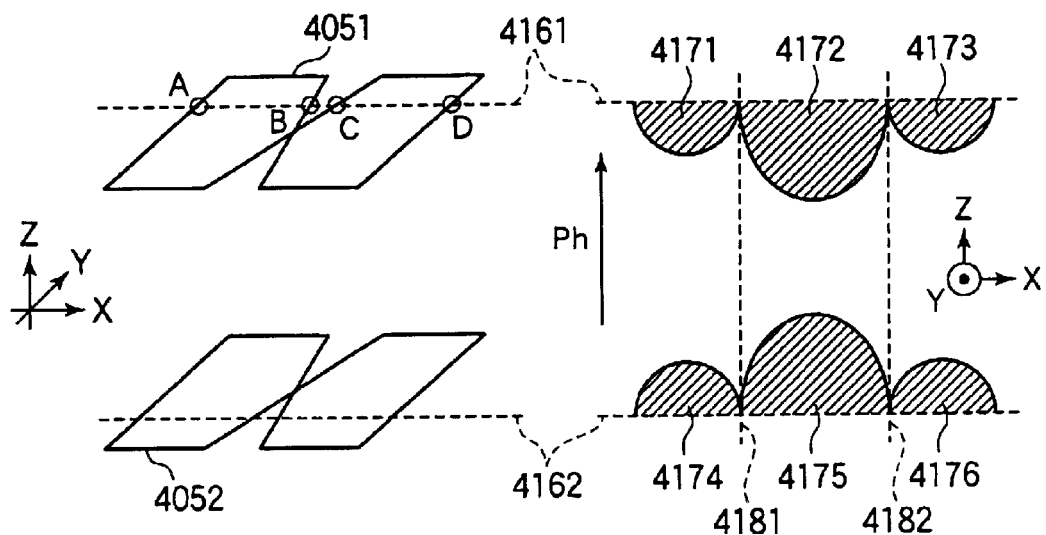
FIGS. 7(A) and 7(B) are views explaining an example of the sensitivity distributions of ordinary eight-shaped RF receiving coils.

Incidentally, there is a problem in that when calculation processing for eliminating aliasing is executed using the measured signals of the plurality of RF receiving coils as described above, low sensitivity regions are formed depending on the positional relationship among the RF receiving coils used in the calculation and the sensitivity distributions thereof, and thus the calculation of Determinant (7) is diverged to thereby cause artifacts and deteriorate image quality. This problem will be explained as to a case in which parallel imaging is executed using the "8-shaped" RF receiving coils 4051 and 4052 as an example. In FIG. 7(A), when the direction of a static magnetic field is a Z-direction, NRM signals (RF magnetic field) turn in the X-Y plane. When the RF receiving coil 4501 is placed on the X-Y plane, sensitivity regions 4171 to 4173 as shown by slanted lines in the figure are formed about a line 4161 that connects points A, B, C, and D on the RF receiving coil. When the "8-shaped" RF receiving coils 4051 and 4052 are used by being disposed in confrontation with each other with a predetermined distance therebetween in the Z-direction as shown in FIG. 7(A), the sensitivity distribution of the RF receiving coil 4051 is shown by the sensitivity regions 4171 to 4173, and the sensitivity distribution of the RF receiving coil 4052 is shown by sensitivity regions 4174 to 4176. When a phase encode (Ph) is set in the direction of an arrow (Z-direction) in FIG. 7(B), the sensitivity of any of the RF receiving coils is uniformly low in cross sections parallel with a Y-axis on lines 4181 and 4182. Accordingly, when the above matrix calculation is executed using the measured data received by these coils, the matrix calculation is diverged and noise and artifacts occur in a resultant image.

Signal processing as a feature of the present invention for solving the above problem will be explained with reference to FIG. 1. The signal processing of FIG. 1 shows a case that imaging is executed at a thinning rate set to ½ (M=2) as an example. In FIG. 1, sensitivity image data 100 is data obtained by executing imaging using the entire body coil. Further, sensitivity image data 1011 to 1018 and measured image data 1021 to 1028 correspond to data obtained by the respective RF receiving coils. 4051 to 4058 shown in FIG. 3, respectively.

The sensitivity image data 1011 to 1018 is data corresponding to the sensitivity distributions of the respective RF receiving coils and used as reference data in the matrix calculation for eliminating aliasing. The sensitivity distribution can be determined by subjecting, for example, the data in the low frequency region of the k space to a low-pass filter. The data of the low frequency region may be previously measured as the sensitivity image data, or the data in the low frequency region of the measured image data may be used as the sensitivity image data. The sensitivity distributions of the respective RF receiving coils are used when the aliasing is eliminated by the matrix calculation which will be described later.

At first step 103 of the signal processing, first, two sets of optimum combinations of a plurality of RF receiving coils (receiving coil groups) are selected from the eight receiving coils based on a measuring slice section and a phase encode direction. The optimum combinations mean combinations by which the matrix calculation executed at step 108 later is not diverged.

Specifically, 1) When the sensitivity distributions of the first receiving coil group is synthesized with those of the second receiving coil group, no low sensitivity distribution region exist in the phase encode direction.

2) The sensitivities of the first receiving coil group are not the same as those of the second receiving coil group. That is, as explained in FIG. 7, the two "8-shaped" RF receiving coils 4051 and 4052, which are disposed in confrontation with each other with the definite distance therebetween in the Z-direction, have the same sensitivity distribution as shown by the slanted portions 4171 to 4173 and the slanted portions 4174 to 4176 of FIG. 7(B). Moreover, since low sensitivity distribution regions are made on the cross sections including the lines 4181 and 4182, the matrix calculation is diverged.

Figures 8A, 8B:
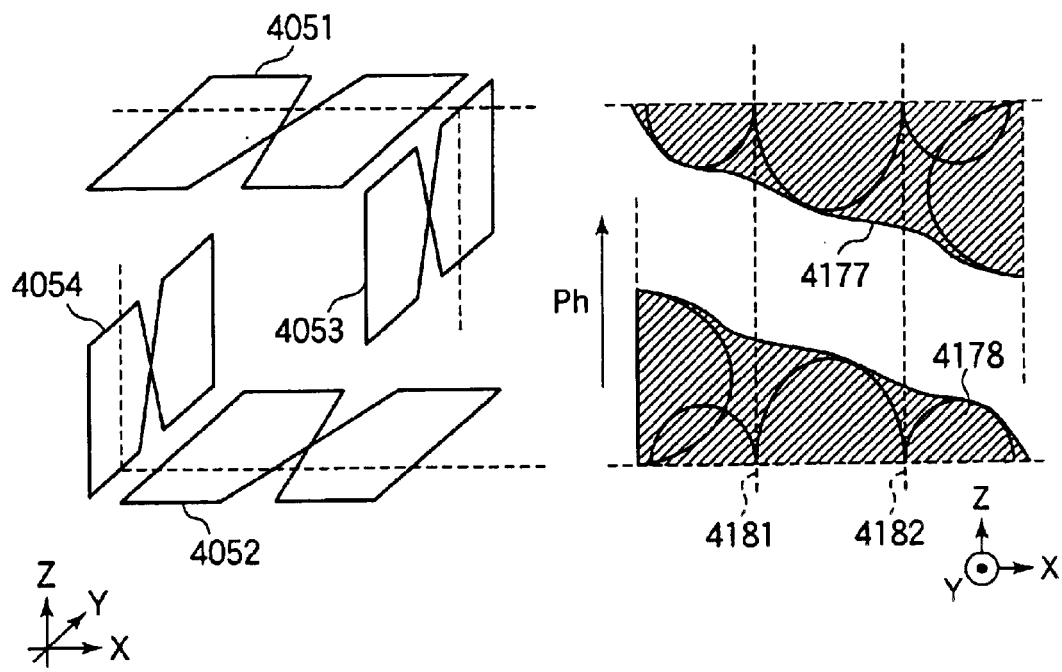
FIGS. 8(A) and 8(B) are views explaining an example of a synthesized sensitivity distribution of a plurality of RF receiving coils according to the present invention and a plurality of combinations of the plurality of RF receiving coils.
Figure 9:
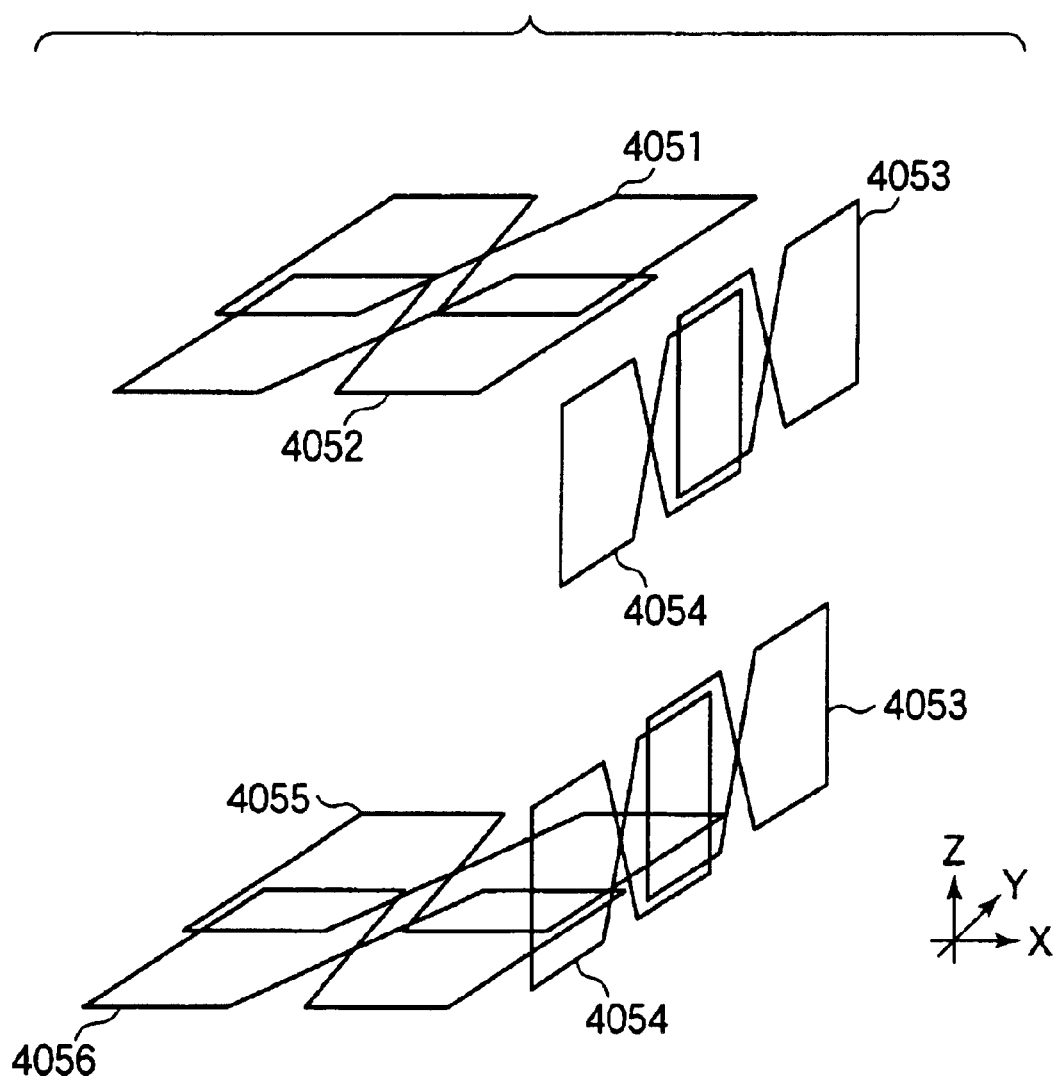
FIG. 9 is a view explaining another example of the plurality of combinations of the plurality of RF receiving coils according to the present invention.

In contrast, as shown in FIG. 8, when two RF receiving coils 4053 and 4054, which are disposed on a plane parallel with a Z-Y plane in confrontation with each other with a definite distance therebetween in an X-direction, are added, and the RF receiving coil 4051 is combined with the RF receiving coils 4053 as well as the RF receiving coil 4052 is combined with the RF receiving coils 4054, the sensitivity distribution 4177 obtained by synthesizing the signals of the RF receiving coils 4051 and 4053 is different from the sensitivity distribution 4178 obtained by synthesizing the signals of the RF receiving coils 4052 and 4054, and the low sensitivity regions are eliminated. As a result, the matrix calculation is not diverged.

When the disposition of the coils is fixed, this optimum combination is determined by a cross section to be measured and a phase encode direction. Accordingly, when these imaging conditions are set, the optimum combination can be automatically selected.

When, for example, a Y-direction is set as the phase encode direction and imaging is executed on the Y-Z plane or the Y-X plane using the RF receiving coils of the multiple RF receiving coil disposed as shown in FIG. 3(A), it is preferable to select the RF receiving coils 4051, 4053, 4055, and 4057 as a first combination and to select the RF receiving coils 4052, 4054, 4056, and 4058 as a second combination as shown in FIG. 3(B). Further, when the imaging is executed on other cross section without varying the positional relationship between the multiple RF receiving coil and the patient, that is, when the imaging is executed on, for example, an X-Z plane setting the X-direction or the Z-direction as the phase encode direction, it is preferable to select the RF receiving coils 4051, 4052, 4053, and 4054 as a first combination and to select the RF receiving coils 4055, 4056, 4057, and 4058 as a second combination as shown in FIG. 3(C).

Next, at step 1051, two sets of sensitivity image data 1041 measured by the RF receiving coils 1011 to 1018 belonging to the selected two combinations is taken out, and the signals of of the RF receiving coils of each combination are synthesized. Likewise, at step 1052, two sets of image data 1042 measured by the RF receiving coils 1021 to 1028 belonging to the selected two combinations is taken out, and the signals of the RF receiving coils of each combination are synthesized. The sensitivity image data and the measured image data obtained by the respective RF receiving coils are ordinarily represented by complex numbers, addition processing of the complex numbers, for example, is executed at steps 1051 and 1052. In this case, the square root of the square sum of the two sets of sensitivity image data 1041 and the square root of the square sum of the two sets of sensitivity image data 1042 may be determined. In this case, there is a merit that an SN ratio is increased as compared with the case of addition. Note that, although the signals are synthesized after they are A/D converted in the signal processing shown in FIG. 4, analog signals may be directly synthesized and then A/D converted.

In this embodiment, the sensitivity distributions 107 of the respective RF receiving coils are obtained by executing sensitivity distribution calculation processing steps 106 using the sensitivity image data 100 measured by the entire body coil and the two sets of sensitivity image data 1041. In the sensitivity distribution calculation processing steps 106, the sensitivity distribution $ci(x, y)$ is determined from the image data $si(x, y)$ of each RF receiving coil by normalizing the image data $si(x, y)$ by Expression (8) using the image data $sc(x, y)$ of the entire body coil.

$$ci(x, y) = si(x, y)/sc(x, y) \qquad (8)$$

An image 110 from which aliasing is eliminated is obtained by executing inverse matrix calculation processing 109 after Determinant (7) is created by matrix creating processing 108 using the thus calculated sensitivity distributions 107 and the measured image data 1042 having aliasing in a final measurement obtained by the respective RF receiving coils. This matrix calculation is executed as to a matrix [G×M] when the thinning rate is 1/M, the number of combinations of the plurality of RF receiving coils is G (where, G=1, . . . , N which corresponds to N of Determinant (7)). In this embodiment, the two receiving coil groups (G=2) are selected and the matrix calculation is executed to the synthesized measured data of these groups, the matrix is arranged in the form of [2×2], by which the matrix calculation can be greatly simplified.

The final image 110 obtained as described above is an image from which aliasing artifacts are eliminated by the matrix calculation, and moreover the measured image data and the sensitivity image data used in the matrix calculation is data obtained by synthesizing the signals measured by the RF receiving coils which are optimally combined so that the matrix calculation is not diverged. Accordingly, a high quality image without deterioration in quality and artifacts due to the matrix calculation can be obtained. Further, the matrix calculation can be very simply executed because only the two sets of data are used.

Although the first embodiment of the present invention has been explained above, the present invention is by no means limited thereto and can be variously modified as described below. For example, although the above embodiment is explained as to the case that the multiple RF receiving coil has the eight RF receiving coils, the number of the RF receiving coils is not limited to eight. That is, as shown in FIG. 8, the number of the RF receiving coils may be four or any number other than four. However, it is preferable that the number of the RF receiving coils be as small as possible in order to simplify a circuit arrangement and to reduce the uncomfortable feeling of the patient.

Further, although the first explains the case that the intervals between the phase encode steps are doubled (thinning rate: ½) and the two sets of combinations of the RF receiving coils are selected, it is possible to make the intervals between the steps threefold and fourfold or more. In this case, the number of combinations G of selected RF receiving coils must be equal to or more than the intervals M between the phase encode steps. To simplify the matrix calculation, it is preferable to set G equal to M.

Incidentally, in the first embodiment, when the first and second combinations of the RF receiving coils are selected, any ones of the RF receiving coils may be commonly used in the combinations. That is, a plurality of combinations of the RF receiving coils may be selected so as to include RF receiving coils common to the combinations therein. This example will be explained with reference to FIG. 9. It is assumed that a multiple RF receiving coil composed of the eight RF receiving coils 4051 to 4058 is also used in this example similar to that shown in FIG. 3. Then, in the example of FIG. 9, the RF receiving coils 4051 to 4054 are selected as a first combination, and the RF receiving coils 4053 to 4056 are selected as a second combination. That is, the RF receiving coils 4053 and 4054 belong to both of the two combinations.

In this case, after the combinations of the RF receiving coils are selected, the data measured by the RF receiving coils is synthesized at steps 1051 and 1052 of FIG. 1, a matrix calculation is executed using measured image data and sensitivity distribution data at steps 108 and 109 to eliminate aliasing artifacts, and then a final image is obtained similarly to the first embodiment.

As described above, since the RF receiving coils common to the combinations can be used in the plurality of combinations of the RF receiving coils, a degree of freedom for selecting the combinations of the coils, by which optimum sensitivity distributions can be obtained, can be increased, thereby an image having more excellent quality can be obtained.

Further, the first embodiment explains the example that the sensitivity distributions of the the respective combinations of the RF receiving coils are determined from the sensitivity image data 1011 to 1018 measured by the respective RF receiving coils and the sensitivity image data 100 measured by the entire body coil. However, a feature of the present invention is to eliminate the low sensitivity distribution region by the combinations of the RF receiving coils. Accordingly, aliasing artifacts can be more accurately eliminated than those eliminated by an MRI apparatus used heretofore even if the sensitivity distributions are not corrected by the sensitivity image data 100 measured by the entire body coil, thereby an image having excellent image quality can be obtained.

Figure 10A:
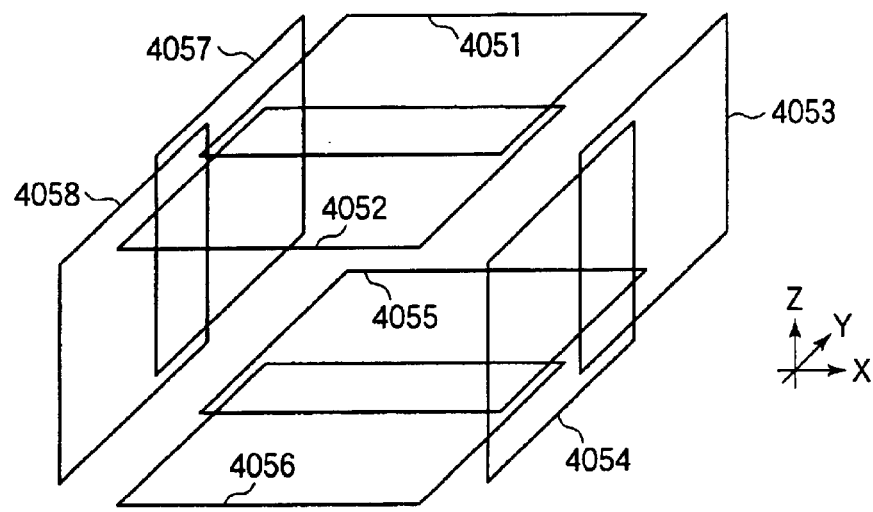
Figure 10B:
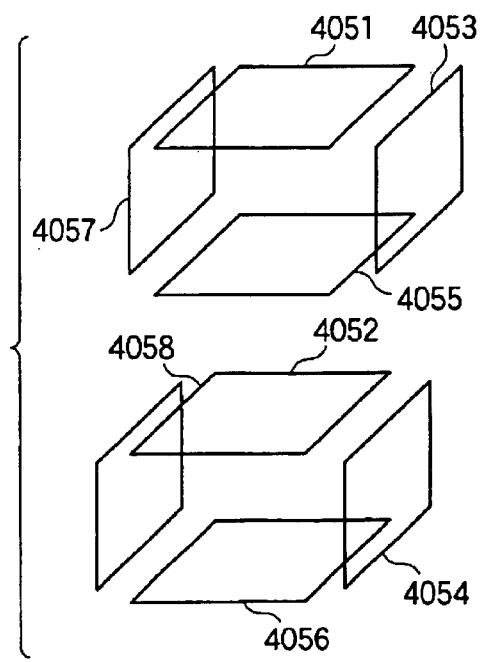
Figure 10C:
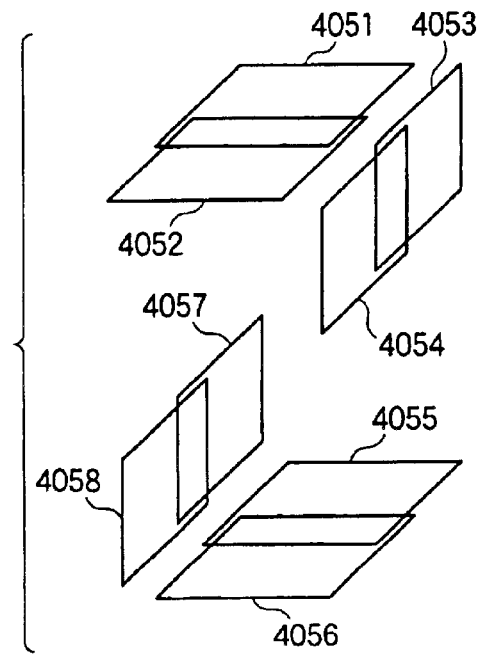

Although the above explanation is made as to the case that the present invention is applied to the MRI apparatus employing the vertical magnetic field, in which the direction of the static magnetic field (Z-direction) is vertical, the present invention is by no means limited thereto and can be applied likewise to a case in which the direction of the static magnetic field is different from the above case (for example, a horizontal magnetic field). FIG. 10 shows, for example, a combination of loop coils applicable to the horizontal magnetic field. In this case, when, for example, the imaging is executed on the Y-Z plane by setting the Y-direction as the phase encode direction or on the X-Z plane by setting the X-direction as the phase encode direction, the coils 4051, 4053, 4055, and 4057 are selected as a first combination, and the coils 4052, 4054, 4056, and 4058 are selected as a second combination as shown in FIG. 10(B). Further, when, for example, the imaging is executed on the X-Y plane by setting the Y-direction as the phase encode direction without changing the positions of the multiple RF receiving-coil and the patient, the RF receiving coils 4051, 4052, 4053, 4054 are selected as the first combination and the RF receiving coils 4055, 4056, 4057, 4058 are selected as the second combination as shown in FIG. 10(C).

In this case, the measured data of each combination of the RF receiving coils, which are selected similarly to the case of FIG. 3, is synthesized, and then a matrix calculation is executed to eliminate the aliasing of an image.

Further, the present invention can be also applied to three-dimensional measurement. In this case, the imaging may be executed at a high speed by thinning data not only in the phase encode direction but also in a slice encode direction or by thinning data by combining the phase encode direction and the slice encode direction, and the combination of the RF receiving coils is selected so that the sensitivity distributions are optimally combined as to the axis in the direction of which the encode steps are thinned.

As described above, according to the first embodiment and its modification of the present invention, an excellent image can be obtained without the deterioration of its quality due to the matrix calculation in a high speed parallel imaging using the multiple RF receiving coil because the optimum combinations of the RF receiving coils are selected taking a measuring slice section and an encode axis into consideration and the matrix calculation is executed as to the measured data having been synthesized.

Further, even if the measuring slice section and the encode axis are changed, a stable image without artifacts and deterioration of its quality can be obtained. Further, it is possible to reduce a load on the matrix calculation and to reconstruct an image at a high speed.

(Second Embodiment)

Figure 11:
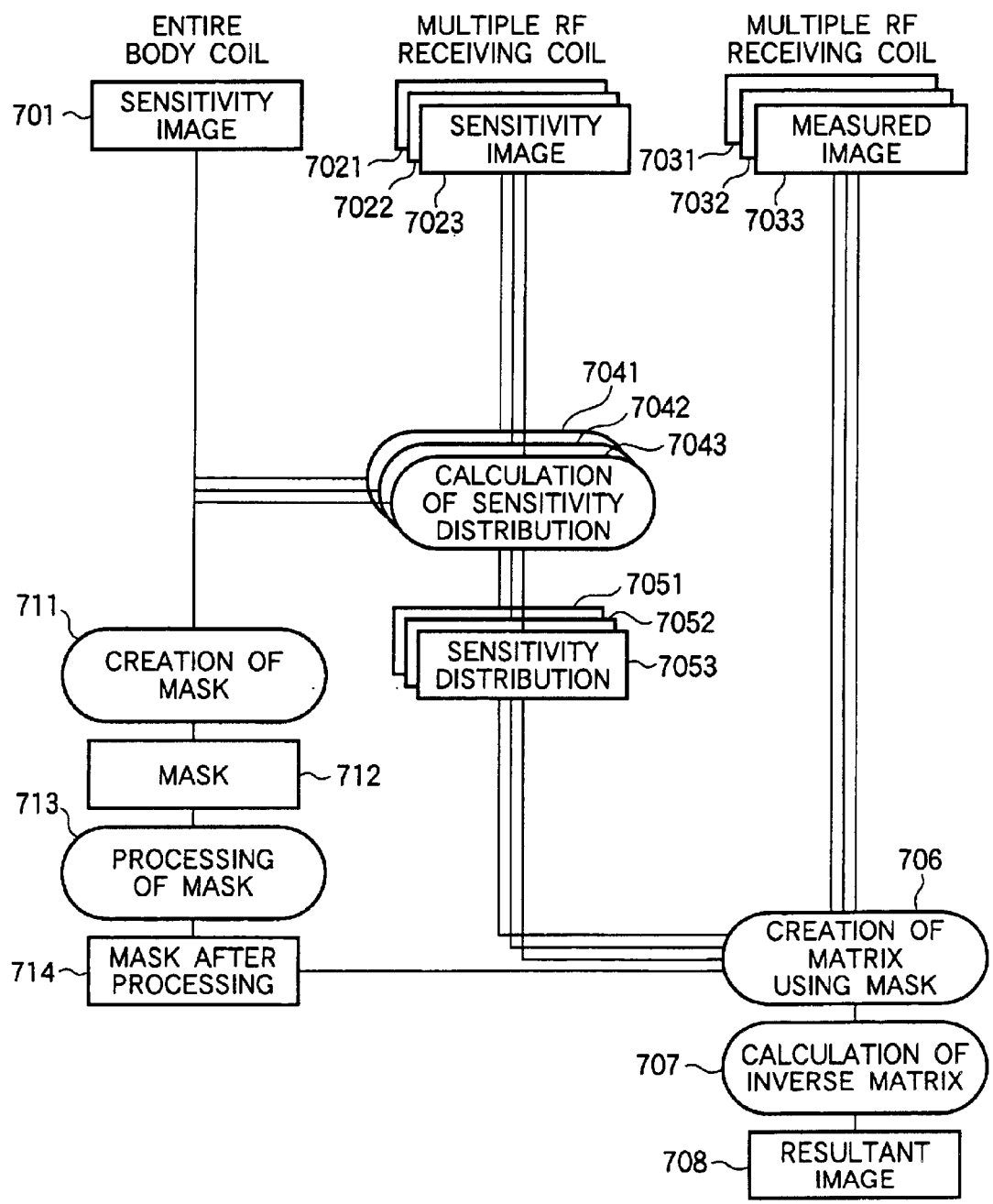
FIG. 11 is a flowchart showing a signal processing sequence in an image reconstruction device according to an MRI apparatus of a second embodiment of the present invention.

Next, a second embodiment of the present invention will be described with respect to FIGS. 11 to 13. In the second embodiment, an example that four RF receiving coils are used as the multiple RF receiving coil different from the example shown in FIG. 3 will be explained. Accordingly, the second embodiment is arranged similarly to that of the first embodiment except that the receiving unit of the measured signals shown in FIG. 4 is arranged to have four channels. Further, since an MRI apparatus is the same as that of the first embodiment shown in FIG. 2 and a pulse sequence is the same as that of the first embodiment shown in FIG. 5, explanation of them is omitted.

An object to be measured, which is generally employed in MRI apparatuses at present, is protons that are a material mainly constituting a patient. The morphology or function of the head, belly, four limbs, and the like of a human body is two-dimensionally or three-dimensionally imaged by transforming the spatial distribution of proton densities and the spatial distribution of induced state relaxing phenomena into images. Array Head Coil for Improved Functional MRI (Christoph Leussler), 1996 ISMRM abstract p. 249 is known as a multiple RF receiving coil for a head used in a horizontal magnetic field. Helmet and Cylindrical Shaped CP Array COILs for Brain Imaging: A Comparison of Signal-to-Noise Characteristics (H. A. Stark, E. M. Haacke), 1996 ISMRM abstract p. 1412 is known as a QD multiple RF receiving coil for a head used in a horizontal magnetic field. Further, Four Channel Wrap-Around Coil with Inductive Decoupler for 1. 5T Body Imaging (T. Takahashi et. al), 1995 ISMRM abstract p. 1418 is known as a QD multiple RF receiving coil for a belly used in an horizontal magnetic field.

The number of times of repetition of imaging is reduced also in this embodiment by a parallel imaging method using a multiple RF receiving coil by thinning the intervals between phase encode steps at a given rate. Accordingly, aliasing explained in FIG. 6 is generated in an image. The aliasing of the image is basically eliminated by the signal processing calculation of Determinant (7) explained in the first embodiment.

A feature of the signal processing calculation for eliminating the aliasing in the second embodiment will be explained according to a processing sequence shown in FIG. 11. In this embodiment, the aliasing is not eliminated by combining a plurality of RF receiving coils, measuring data by a plurality of sets of the RF receiving coils, synthesizing the data measured by each set of the RF receiving coils, and calculating Determinant (7) using the measured and synthesized data as executed in the first embodiment. The feature of this embodiment is to reduce image deteriorating causes such as artifacts and the like which occur in association with elimination of aliasing by eliminating the data of a low signal region included in respective measured data by a mask when the data measured by the plurality of RF receiving coils is applied to the calculation of Determinant (7).

A signal processing method employed in the parallel imaging method of this embodiment will be explained with reference to FIG. 11. This embodiment is composed of a single entire body coil and the multiple RF receiving coil including at least three RF receiving coils. First, image data calculation processing are executed at steps 7041 to 7043 using a sensitivity image 701 obtained by the entire body coil and sensitivity images 7021–7023 obtained by the respective RF receiving coils, thereby the sensitivity distributions 7051 to 7053 of the respective RF receiving coils are obtained. The sensitivity distribution calculation processing steps 704 are executed using Expression (8) similarly to the sensitivity distribution calculation processing steps 106 of FIG. 1.

An image 708 from which aliasing is eliminated is obtained by executing inverse matrix calculation processing 707 after Determinant (7) is created by matrix creating processing 706 using the thus calculated sensitivity distributions 7051 to 7053 and the measured image data 7031 to 7033 having aliasing in a final measurement obtained in the respective RF receiving coils. When signal components in a low signal region are included in the image data 7031–7033 in the final calculation in the matrix calculation, an error is increased in the result of calculation and image quality is deteriorated as described above.

To cope with the above problem, the feature of this embodiment resides in that the mask 712 is created using the sensitivity image 701 of the entire body coil at step 711, the accuracy of the mask 712 is improved at step 713, a mask 714 whose accuracy is improved is created by processing the mask 712 at step 713, and matrix creation processing 706 is executed using the mask 714.

Figure 12A:
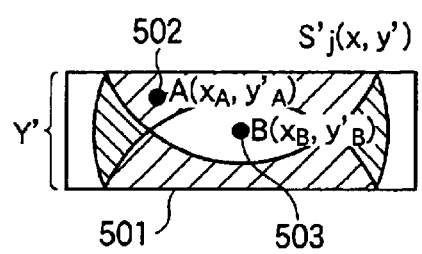
FIGS. 12(A) to 12(D) are views explaining a mask making method according to the second embodiment of the present invention.
Figure 12B:
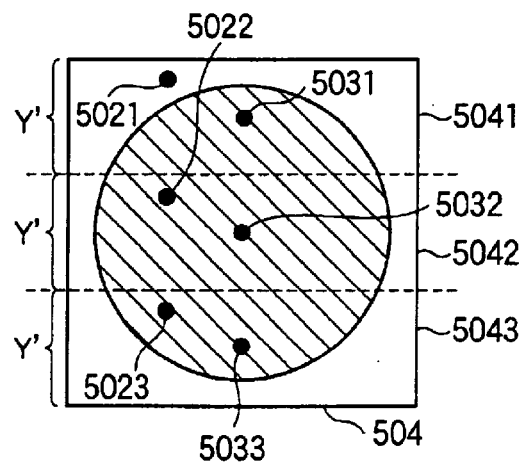
Figure 12C:
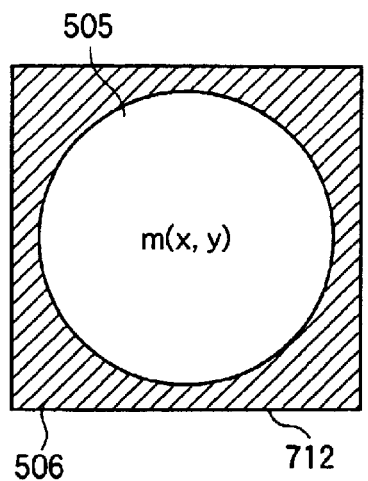

The processing of the mask will be explained with reference to FIGS. 12(A), 12(B), and 12(C) which show a case that the imaging is executed at a triple-speed. In these figures, FIG. 12(A) shows an image 501 having aliasing which results from that the three regions 5041, 5042, 5043 of an ordinary image 504 shown in FIG. 12(B) overlap, in which Y'=Y/3, and $1 \leq y' \leq Y'$. In FIG. 12(A), noted points A $(X_A, y'_A)$ 502 and B $(X_B, Y'_B)$ 503 are set at two positions. At this time, the pixel values s' $(X_A, y'_A)$ and s' $(X_B, y'_B)$ of the points A and B can be represented by Expression (9) because the regions, which include points 5021 to 5023 and 5031 to 5033 of FIG. 12(B), overlap. In Expression (9), d represents a constant.

$$s'_i(x_A, y'_A) = \frac{s_i(x_A, y'_A)}{d} + \frac{s_i(x_A, y'_A + Y')}{d} + \frac{s_i(x_A, y'_A + 2xy')}{d} \quad (9)$$

$$s'_i(x_B, y'_B) = \frac{s_i(x_B, y'_B)}{d} + \frac{s_i(x_B, y'_B + Y')}{d} + \frac{s_i(x_B, y'_B + 2xY')}{d}$$

Figure 12D:
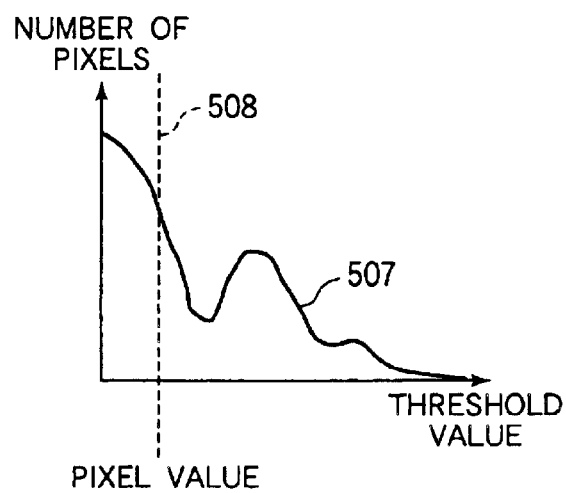

However, since data measured at the point 5021 shows the signal of a background portion where no patient exists, when a matrix calculation is executed using the data, the matrix is diverged when an inverse matrix calculation is executed, and spot artifacts may be occurred in a resultant image. To eliminate the affect of the background, the mask 712 m(x, y) as shown in FIG. 12(C) is created so that the low signal of the background portion is eliminated. As a specific example of the mask creation processing executed at step 711 of FIG. 11, a threshold value, for example, is set to the sensitivity image 701 of the entire body coil, and it is determined that the region, in which the pixel value of the image shown in FIG. 12(C) is equal to or less than the threshold value, is a background region 506 and that the region, in which the pixel value of the image shown in FIG. 12(C) is more than the threshold value, is a patient region 505. As a method of setting the threshold value, for example, about ⅒ of a maximum pixel value in an image may be set as the threshold value or a threshold value 508 may be set by creating the histogram 507 of the pixel values in the image and determining a noise distribution as shown in FIG. 12(D).

Next, the mask 712, in which the value of the patient region 505 is set to "1" and the value of the background region 506 is set to "0" is created by the mask creation processing at step 711. Then, the thus created mask 712 is processed at step 713 to improve its accuracy. Then, matrix creation processing is executed at step 706 using the mask 714 having been processed at step 713.

With the above operation, since a matrix calculation can be executed by eliminating the measured signal component of the background region, occurrence of spot artifacts can be prevented.

The mask processing at step 713 is executed in such a manner that when, for example, a structure exists in the interior of the patient, the region of the mask is buried by interpolation in order to use the signals in the region of the patient as they are or that isolated points set in a region, which is not essentially included in a calculation, are eliminated.

Further, in the matrix creation processing executed using the mask at step 706, determination processing is executed to set respective matrix elements to "0" as shown in, for example, Expression (10) so that no background region is not included in the matrix elements.

when $m(x, y'+(j-1) \times Y')=0$, $ci(x, y'+(j-1) \times Y')=0$ (10)

Further, when an image is made unnatural by setting the background region to "0", the processing may be executed by setting matrix elements to a predetermined constant as shown in, for example, Expression (11).

when $m(x, y'+(j-1)\times Y)=0$, $ci(x, y'+(j-1)\times Y)=$Const. (11)

where, Const. represents an arbitrary constant.

Further, in the matrix creation processing executed using at step 706, the determination processing for setting the respective elements shown in Expression (10) to 0 is equivalent to determining a product of the sensitivity distribution shown in Expression (12) and the mask. Thus, when Expression (12) is applied, the processing at step 706 can be simplified by eliminating the determination processing.

$$ci(x, y) \times m(x, y) \quad (12)$$

Further, as shown in Expression (10), setting a part of the matrix elements to "0" is equivalent to reduce a matrix size. That is, this is equivalent to examining an aliasing state of each pixel, determining a necessary and sufficient matrix size, and executing a necessary and sufficient calculation. Accordingly, mixture of unnecessary noise is eliminated as compared with a known MRI apparatus, thereby image quality is improved. Further, there is also a merit that a calculation time is reduced.

It should be noted that although the calculation is executed using the mask 714 having been processed in the matrix creation processing at step 706, it is also possible to execute the calculation using the mask 712. As a result, the processing flow can be simplified.

While the mask 712 composed of the background region and the patient region has been explained, the background region can include not only the background externally of the patient region but also low signal regions (for example, voids and the like) existing in the patient region.

(Third Embodiment)

Figure 13:
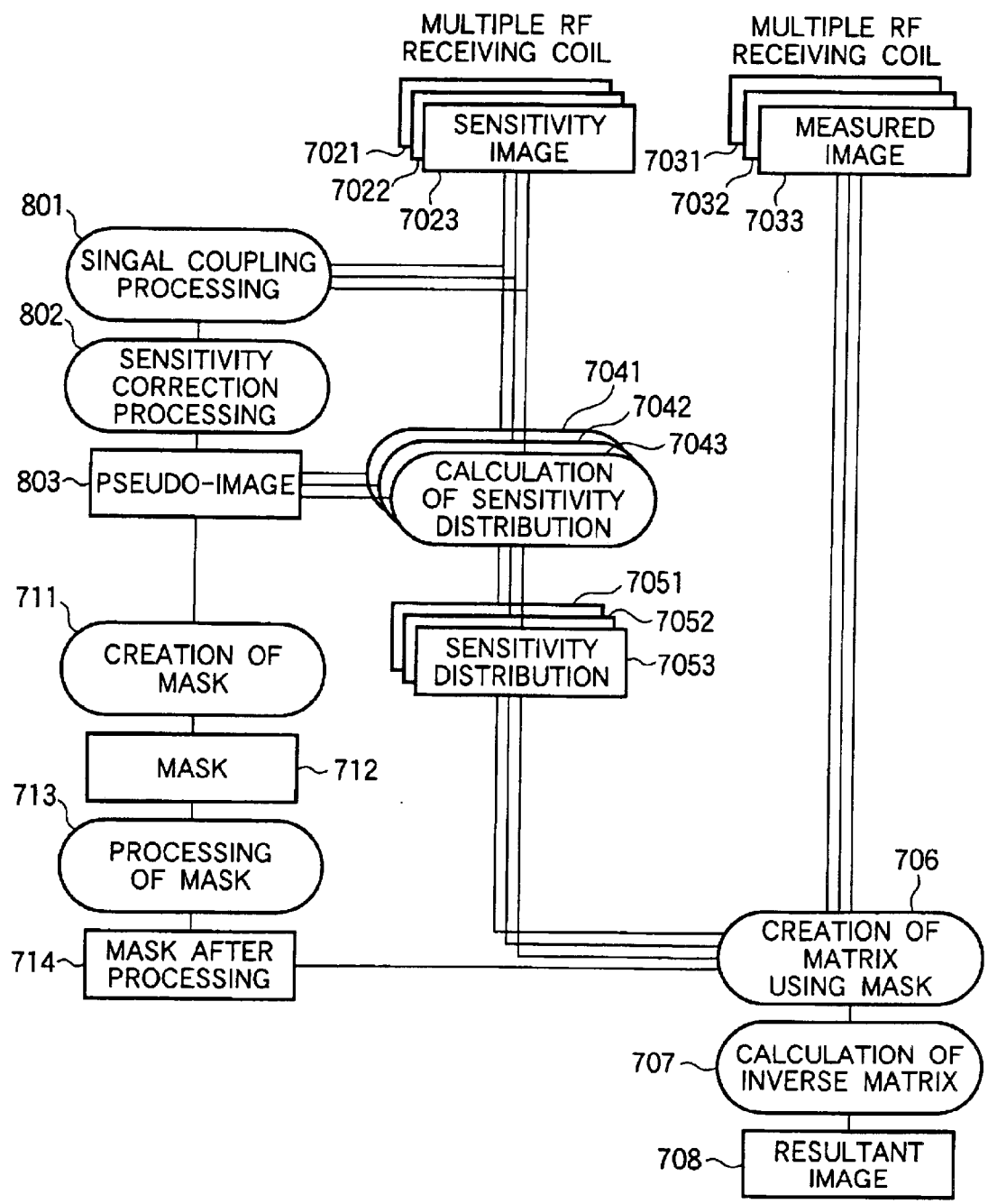
FIG. 13 is a flowchart showing other signal processing sequence in an image reconstruction device of a third embodiment of the present invention.

FIG. 13 shows a modification of the second embodiment. This embodiment shows a case that the sensitivity image of an entire body coil necessary to calculate the sensitivity distributions of respective RF receiving coils cannot be obtained. In this case, a pseudo image is created by signal coupling processing executed at step 801 in place of the sensitivity image of the entire body coil. In the signal coupling processing executed at step 801, images wi(x, y) are obtained by filtering, for example, the sensitivity images si(x, y) obtained by the respective RF receiving coils with a low-pass filter. Thus, it is possible to determine pseudo body coil images s'c (x, y) after they have been synthesized can be obtained by Expression (13).

$$s'_c(x, y) = \frac{\sum_{i=1}^{N} s_i(x, y) \cdot w_i * (x, y)}{\sqrt{\sum_{i=1}^{N} |w_i(x, y)|^2}} \quad (13)$$

where, * represents a complex conjugate, and | | represents an absolute value.

Incidentally, the RF receiving coils constituting a multiple RF receiving coil have a sensitive region narrower than that of ordinary RF receiving coils. Accordingly, the pseudo sensitivity image of the body coil synthesized as described above may be greatly affected by shading. To cope with this problem, the synthesized pseudo sensitivity image of the body coil is subjected to sensitivity correction processing at step 802. With this processing, a pseudo image 803 without shading is created. Note that a correction method of calculating the shading from, for example, an image (Japanese Unexamined Patent Application Publication No. 7-222724), is employed as the sensitivity correction processing executed at step 802.

As described above, according to this embodiment, since the image signals of the entire body coil are synthesized, the parallel imaging method can be applied even to, for example, an MRI apparatus which is not provided with or cannot be provided with the entire body coil and to a MRI apparatus provided with RF receiving coils whose number of usable channels is small.

Further, since the MRI apparatus having the entire body coil is required only to process the signals of the multiple RF receiving coil, the arrangement of the apparatus and software as well as data flow can be simplified. For example, the RF irradiation coils of a hamburger type open MRI apparatus may not receive signals because the sensitivity thereof is relatively low. Further, even if they can physically receive the signals, attaching receiving parts dedicated only for the parallel imaging method to the apparatus will increase the cost thereof. However, the above demerit can be overcome by applying this embodiment to the MRI apparatus. The calculation of the sensitivity distributions can be also applied to multi-slice imaging and three-dimensional imaging. In the multi-slice imaging, Expression (13) is calculated each time slicing is executed. In the three-dimensional imaging, Expression (13) is also calculated each time slicing is executed.

The present invention is not limited to the contents disclosed in the second embodiment described above and can be embodied in various modes which do not depart from the gist of the present invention. Although this embodiment exemplifies the parallel imaging method applied to the case that the multiple RF receiving coil use three RF receiving coils, the number N of the RF receiving coils may be set to any arbitrary number of two or more. Further, although this embodiment shows the example in which the multiple speed number M is set to 2 or 3, it can be selected within the range of M≦N.

Further, the gradient echo sequence has been described as the pulse sequence used in the first to third embodiments of the present invention, the parallel imaging method does not depend on a type of the sequence. The parallel imaging method can be applied to, for example, an SE sequence, FSE sequence, EPI sequence, spiral sequence, SSFP sequence, and the like.

When the present invention is applied to a three-dimensional measurement, it is possible to increase a measuring speed by thinning data not only in the phase encode direction but also in the slice encode direction. Otherwise, it is possible to increase the measuring speed by thinning data by combining the phase encode direction and the slide direction. Further, when a heart is imaged by applying this algorithm, an image without spot artifacts can be obtained in fast time-resolution.

As described above, according to the present invention, spot artifacts can be eliminated by the parallel imaging method. Further, the parallel imaging method can be executed even in an MRI apparatus without an entire body coil. Furthermore, even in an MRI apparatus having an entire body coil, it is possible to execute the parallel imaging method only by the signals of multiple RF receiving coil. Thus, the number of channels to be used of the RF receiving coils can be reduced, and the arrangement of the MRI apparatus, signal processing, and data flow can be simplified.

(Fourth Embodiment)

Figure 14:
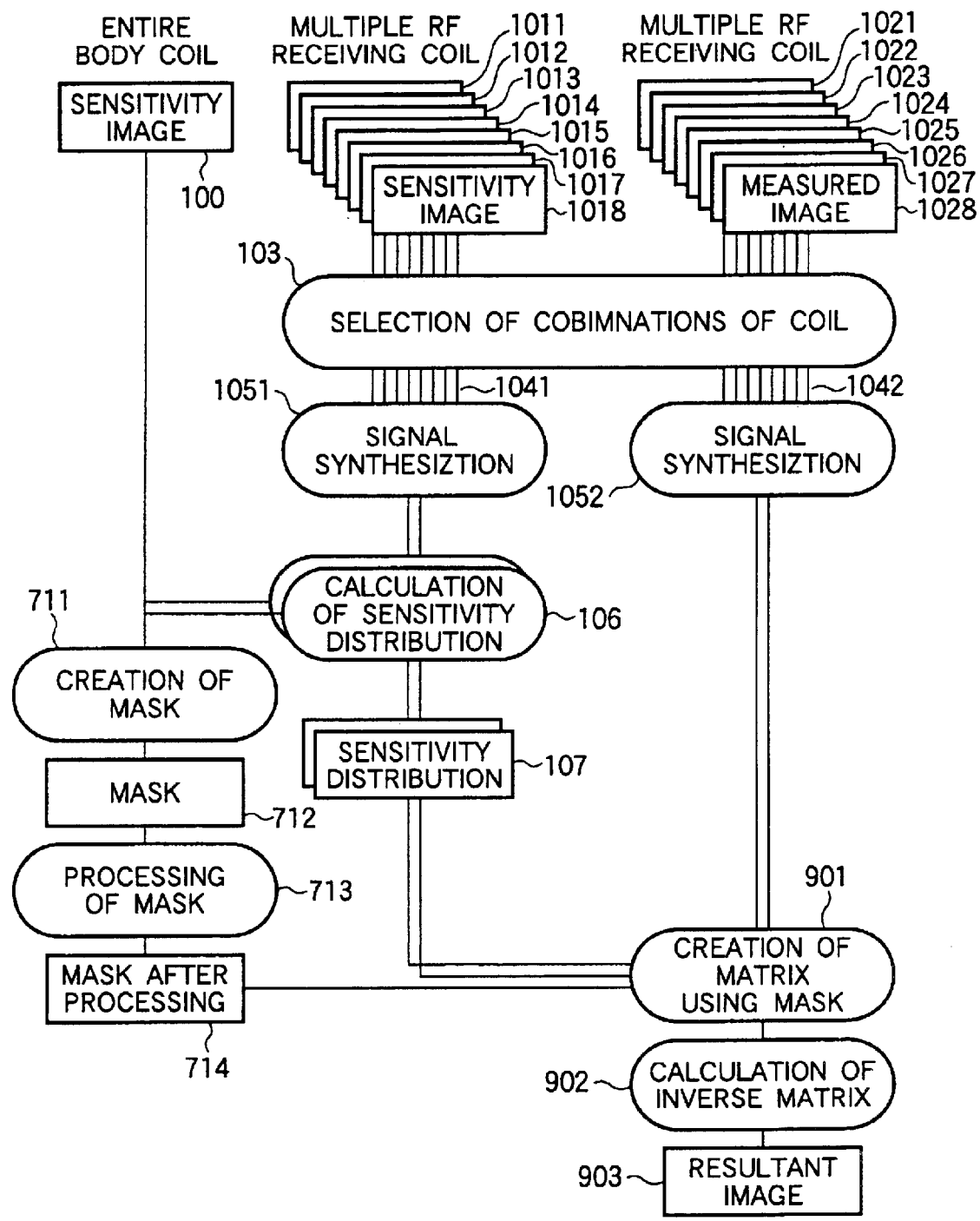
FIG. 14 is a flowchart showing a signal processing sequence in an image reconstruction device according to an MRI apparatus of a fourth embodiment of the present invention.

FIG. 14 is a view showing a signal processing sequence in an image reconstruction device according to an MRI apparatus of a fourth embodiment of the present invention. The embodiment is arranged by combining the embodiment of FIG. 1 and the embodiment of FIG. 11. In FIG. 14, image data, steps, and the like having the same functions as those in FIGS. 1 and 11 are denoted by the same reference numerals and the description thereof is omitted. Note that steps 901, 902, and 903 in FIG. 14 correspond to steps 706, 708, and 709 of FIG. 11, respectively.

That is, a first feature of the embodiment resides in that a plurality of preset RF receiving coil groups are selected by combining a plurality of RF receiving coils according to the imaging conditions as in the first embodiment. That is, the data measured by the respective RF receiving coils of each of the plurality of selected RF receiving coil groups is synthesized, and aliasing artifacts are eliminated by calculating Determinant (7) as to the synthesized data. Further, a second feature of the embodiment resides in that the data of the low signal region contained in respective measured data is eliminated by a mask when the data measured by the plurality of RF receiving coils is applied to the calculation of Determinant (7). Image deteriorating causes such as artifacts and the like, which occur in association with elimination of aliasing, can be more reduced by these features.

What is claimed is:

1. A magnetic resonance imaging apparatus comprising magnetic field generation means for applying gradient magnetic fields and a radio-frequency magnetic field to a patient placed in a static magnetic field in a predetermined pulse sequence; a plurality of RF receiving coils for receiving the nuclear magnetic resonance signals generated from the patient; and image reconstruction means for reconstructing an image by processing the nuclear magnetic resonance signals measured by thinning the encode steps in a measuring space, wherein the image reconstruction means determines measured signal components at a plurality of points on a measuring slice section of the patient by a matrix calculation based on the correlation among the measured signals received by the RF receiving coils, the sensitivity distributions of the RF receiving coils and the measured signal components at the plurality of points on the measuring slice section as well as comprises means for eliminating for suppressing or eliminating the low signal region of the measured signals measured on the measuring slice section.

2. A magnetic resonance imaging apparatus according to claim 1, characterized in that each of the plurality of preset RF receiving coil groups is set based on sensitivity distributions as to a phase encode axis in the measuring space.

3. A magnetic resonance imaging apparatus according to claim 1, characterized in that the calculation means unfolds the aliasing of an image by establishing simultaneous equations representing the correlation between the synthesized data and the measured signal components at the plurality of points on the measuring slice section, solving the simultaneous equations by a matrix calculation, and determining the measured signal components at the plurality of points on the measuring slice section.

4. A magnetic resonance imaging apparatus according to claim 1, characterized in that the number G of the plurality of RF receiving coil groups selected by the coil selection means is set to G=M when the thinning rate of a phase encode is set to 1/M in an imaging.

5. A magnetic resonance imaging apparatus according to claim 1, characterized in that the plurality of RF receiving coil groups selected by the coil selection means includes a common RF receiving coil.

6. A magnetic resonance imaging apparatus comprising magnetic field generation means for applying gradient magnetic fields and a radio-frequency magnetic field to a patient placed in a static magnetic field in a predetermined pulse sequence; a multiple RF receiving coil comprising at least three RF receiving coils for receiving the nuclear magnetic resonance signals generated from the patient; and image reconstruction means for reconstructing an image by processing the received nuclear magnetic resonance signals, wherein the image reconstruction means comprises coil selection means for selecting a plurality of RF receiving coil groups that are preset by combining the plurality of RF receiving coils according to imaging conditions; synthesization means for synthesizing the measured data received by the respective RF receiving coils of each of the plurality of selected RF receiving coil groups and calculation means for eliminating aliasing artifacts by executing a matrix calculation as to the synthesized data.

7. A magnetic resonance imaging method of obtaining an image using a magnetic resonance imaging apparatus comprising a multiple RF receiving coil including at least three RF receiving coils by processing nuclear magnetic resonance signals received by the respective RF receiving coils by executing an imaging by thinning encode steps in a phase encode direction and/or in a slice encode direction, the method comprising the steps of:

selecting a plurality of combinations each including a plurality of RF receiving coils according to a measuring slice section or to the phase encode direction and/or the slice encode direction;

synthesizing the data measured by the respective RF receiving coils of the selected combinations of the RF receiving coils; and creating image data from which aliasing artifacts are eliminated by executing a matrix calculation using measured and synthesized data and sensitivity distribution as to each combination of the RF receiving coils.

8. A magnetic resonance imaging apparatus according to claim 7, characterized in that the aliasing eliminating calculation eliminates the aliasing of the image by establishing simultaneous equations representing the correlation between the nuclear magnetic resonance signals received by the respective RF receiving coils and the signal components at the plurality of points on the measuring slice section and determining the signal components at the plurality of point on the measuring slice section by solving the simultaneous equations by a matrix calculation.

9. A magnetic resonance imaging apparatus according to claim 8, characterized in that the control means is arranged such that the receiving sensitivity distributions of the entire region including the RF receiving coils are determined by executing a calculation using the signals from the plurality of RF receiving coils.

10. A magnetic resonance imaging apparatus according to claim 8, comprising a second RF receiving coil covering a receiving region including the receiving regions of the plurality of RF receiving coils, and the control means obtains the receiving sensitivity distributions of the entire region by the second RF receiving coil.

11. A magnetic resonance imaging apparatus according to any of claim 7, characterized in that the control means is arranged such that the non-image region in the receiving sensitivity distributions is a low signal region.

12. A magnetic resonance imaging apparatus comprising at least two RF receiving coils and control means for obtaining images from the respective RF receiving coils by measuring the nuclear magnetic resonance signals received by the RF receiving coils by thinning the encode steps in a measuring space and executing a calculation for eliminating the aliasing of the respective images using the receiving sensitivity distributions of the respective RF receiving coils as well as obtaining a single image by coupling the respective images, the magnetic resonance imaging apparatus characterized in that the control means creates a mask, which is divided into a non-image region and an image region, to an image obtained in a final measurement based on image data obtained by the above measurement and executes a calculation for eliminating the aliasing using the mask.

13. A magnetic resonance imaging apparatus according to claim 12, characterized in that the control means creates a mask in which a non-image region and an image region are divided in the receiving sensitivity distributions of an entire region including the RF receiving coils and executes a calculation using the receiving sensitivity distribution of each RF receiving coil and the mask.

14. A magnetic resonance imaging apparatus comprising at least two RF receiving coils and control means for obtaining a sensitivity image and a morphological image of each of the RF receiving coils by measuring the nuclear magnetic resonance signals received by the RF receiving coils by thinning the encode steps in a measuring space and executing a calculation for eliminating the aliasing of the respective morphological images from the sensitivity distributions based on the sensitivity images of the RF receiving coils as well as obtaining a single morphological image by coupling the above respective morphological images, characterized in that the control means creates an entire sensitivity image in which the sensitivity images obtained by the respective RF receiving coils are combined, calculates the sensitivity distributions of the respective RF receiving coils using the entire sensitivity distribution, creates a mask for dividing the non-image region and the image region of an image using the entire sensitivity image, and executes a calculation based on the mask.

15. A magnetic resonance imaging apparatus comprising a first RF receiving coil for receiving an entire measuring region, a plurality of second RF receiving coils for receiving a region in which the entire measuring region is divided into at least two sub-regions, and a control means for obtaining a sensitivity image a morphological image of each of the RF second receiving coils by measuring the nuclear magnetic resonance signals received by the second RF receiving coils by thinning the encode steps in a measuring space and for executing a calculation for eliminating the aliasing of the morphological images from the sensitivity distributions determined from the sensitivity image created by the first RF receiving coil and the sensitivity distributions determined from the sensitivity images created by the second RF receiving coils as well as obtaining a single morphological image by coupling the respective morphological images, the magnetic resonance imaging apparatus characterized in that the control means creates a mask in which a non-image region and an image regions are divided in the receiving sensitivity distributions and executes a calculation using the mask.

16. A magnetic resonance imaging apparatus comprising magnetic field generation means for applying gradient magnetic fields and a radio-frequency magnetic field to a patient placed in a static magnetic field in a predetermined pulse sequence, a first RF receiving coil for receiving the nuclear magnetic resonance signals generated from the entire measuring region of the patient; a plurality of second RF receiving coils for receiving the nuclear magnetic resonance signals generated from the patient, and image reconstruction means for reconstructing an image by processing the nuclear magnetic resonance signals received by thinning the encode steps in a measuring space, wherein the image reconstruction means comprises:
coil selection means for selecting a plurality of RF second receiving coil groups that are preset by combining the plurality of second RF receiving coils according to imaging conditions;
first synthesization means for synthesizing the present measured data received by the respective second RF receiving coils of each of the plurality of selected second RF receiving coil groups;
second synthesization means for synthesizing the previous measured data received by the respective second RF receiving coils of each of the plurality of selected second RF receiving coil groups;
sensitivity distribution calculation means for calculating the sensitivity distribution of each of the second RF receiving coil groups based on the second synthesized data synthesized by the second-synthesization means;
low signal region setting means for setting the low signal region on a measuring slice section based on the data measured by the second synthesization means; and
matrix calculation means for eliminating aliasing artifacts by executing a matrix calculation excluding the sensitivity distribution of each of the RF receiving coil groups and the data included in the low signal region, which is set by the low signal region setting means, of the first synthesized data synthesized by the first synthesization means.

17. A magnetic resonance imaging apparatus comprising:
magnetic field generation means for applying gradient magnetic fields and a radio-frequency magnetic field to a patient placed in a static magnetic field in a predetermined pulse sequence; a plurality of RF receiving coils for receiving the nuclear magnetic resonance signals generated from the patient; and image reconstruction means for reconstructing an image by processing the nuclear magnetic resonance signals received by thinning the encode steps in a measuring space,
wherein the image reconstruction means comprising:
pseudo image creation means for creating a pseudo image corresponding to the sensitivity image of an entire measuring region based on the previous measured data received by the respective RF receiving coils;
sensitivity distribution calculation means for calculating the sensitivity distributions of the respective RF receiving coils by normalizing the previous measured data received by the respective RF receiving coils by the pseudo image; and
matrix calculation means for eliminating aliasing artifacts by a matrix calculation using the present measured data received by the RF receiving coils and the sensitivity distributions of the respective RF receiving coils calculated by the sensitivity distribution calculation means.

18. A magnetic resonance imaging apparatus according to claim 17, characterized in that the image reconstruction means comprises coil selection means for selecting a plurality of second RF receiving coil groups that are preset by combining the plurality of second RF receiving coils according to imaging conditions,
wherein the present measured data received by the respective RF receiving coils is synthesized data created by synthesizing the present measured data of each of the plurality of selected RF receiving coil groups; and the previous measure data received by the respective RF receiving coils is synthesized data created by synthesizing the present measured data of each of the plurality of selected RF receiving coil groups.

* * * * *